US008653562B2

(12) United States Patent
Yuan et al.

(10) Patent No.: US 8,653,562 B2
(45) Date of Patent: Feb. 18, 2014

(54) STRUCTURE OF A HIGH ELECTRON MOBILITY TRANSISTOR

(75) Inventors: Cheng-Guan Yuan, Tao Yuan Shien (TW); Shih-Ming Joseph Liu, Tao Yuan Shien (TW)

(73) Assignee: WIN Semiconductor Corp., Tao Yuan Shien (TW)

( * ) Notice: Subject to any disclaimer, the term of this patent is extended or adjusted under 35 U.S.C. 154(b) by 154 days.

(21) Appl. No.: 13/339,055

(22) Filed: Dec. 28, 2011

(65) Prior Publication Data
US 2013/0082305 A1 Apr. 4, 2013

(30) Foreign Application Priority Data

Sep. 30, 2011 (TW) .............................. 100135477 A

(51) Int. Cl.
*H01L 29/778* (2006.01)
(52) U.S. Cl.
USPC ..... 257/194; 257/183; 257/195; 257/E29.246
(58) Field of Classification Search
USPC .................... 257/194–195, 183, 76, E29.246
See application file for complete search history.

(56) References Cited

U.S. PATENT DOCUMENTS

| 5,324,682 | A * | 6/1994 | Tserng ........................... 438/172 |
| 6,919,589 | B2 * | 7/2005 | Noda .............................. 257/190 |
| 7,964,896 | B2 * | 6/2011 | Kiewra et al. .................. 257/194 |
| 8,338,241 | B2 * | 12/2012 | Yoon et al. ..................... 438/172 |
| 2004/0119090 | A1 * | 6/2004 | Chiu et al. ....................... 257/194 |
| 2009/0267078 | A1 * | 10/2009 | Mishra et al. .................... 257/76 |
| 2011/0147798 | A1 * | 6/2011 | Radosavljevic et al. ....... 257/194 |
| 2012/0196419 | A1 * | 8/2012 | Kanamura et al. ............. 438/287 |
| 2013/0105817 | A1 * | 5/2013 | Saunier ............................ 257/77 |

* cited by examiner

*Primary Examiner* — Thanh Nguyen
(74) *Attorney, Agent, or Firm* — Muncy, Geissler, Olds & Lowe, PLLC

(57) ABSTRACT

An improved structure of the high electron mobility transistor (HEMT) and a fabrication method thereof are disclosed. The improved HEMT structure comprises a substrate, a channel layer, a spacing layer, a carrier supply layer, a Schottky layer, a first etch stop layer, a first n type doped layer formed by $Al_xGa_{1-x}As$, and a second n type doped layer. The fabrication method comprises steps of: etching a gate, a drain, and a source recess by using a multiple selective etching process. Below the gate, the drain, and the source recess is the Schottky layer. A gate electrode is deposited in the gate recess to form Schottky contact. A drain electrode and a source electrode are deposited to form ohmic contacts in the drain recess and the source recess respectively, and on the second n type doped layer surrounding the drain recess and the source recess respectively.

22 Claims, 23 Drawing Sheets

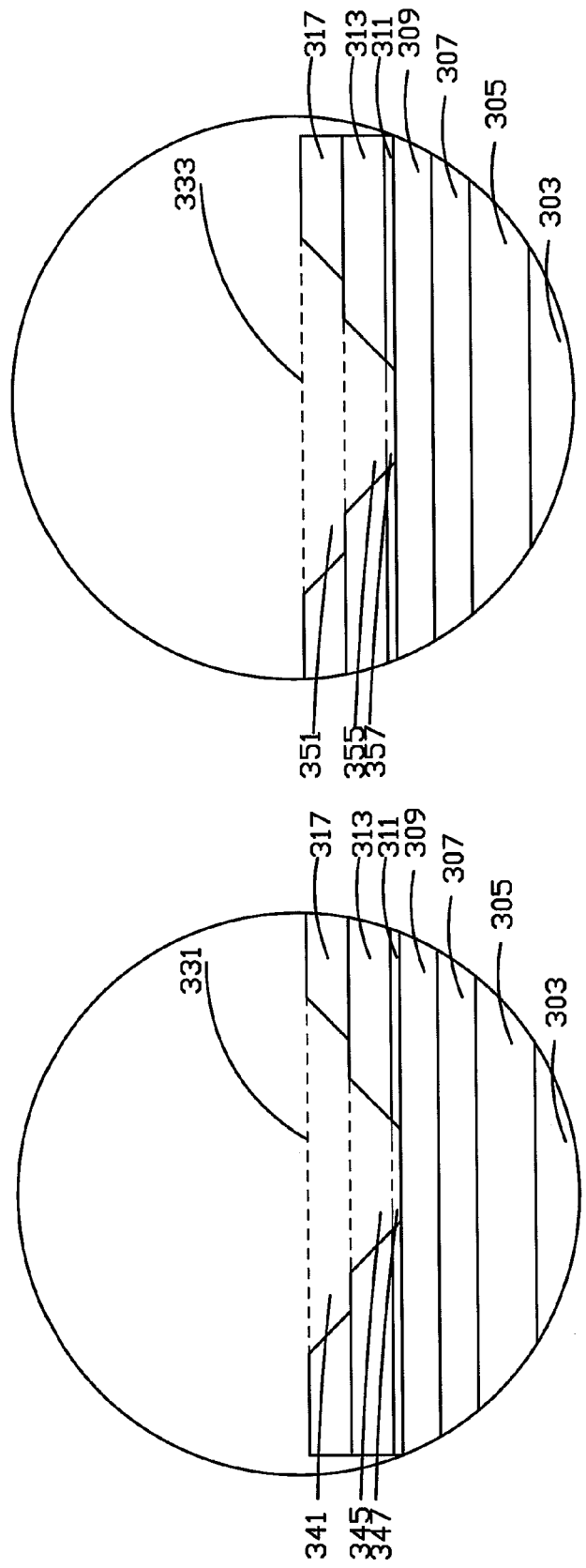

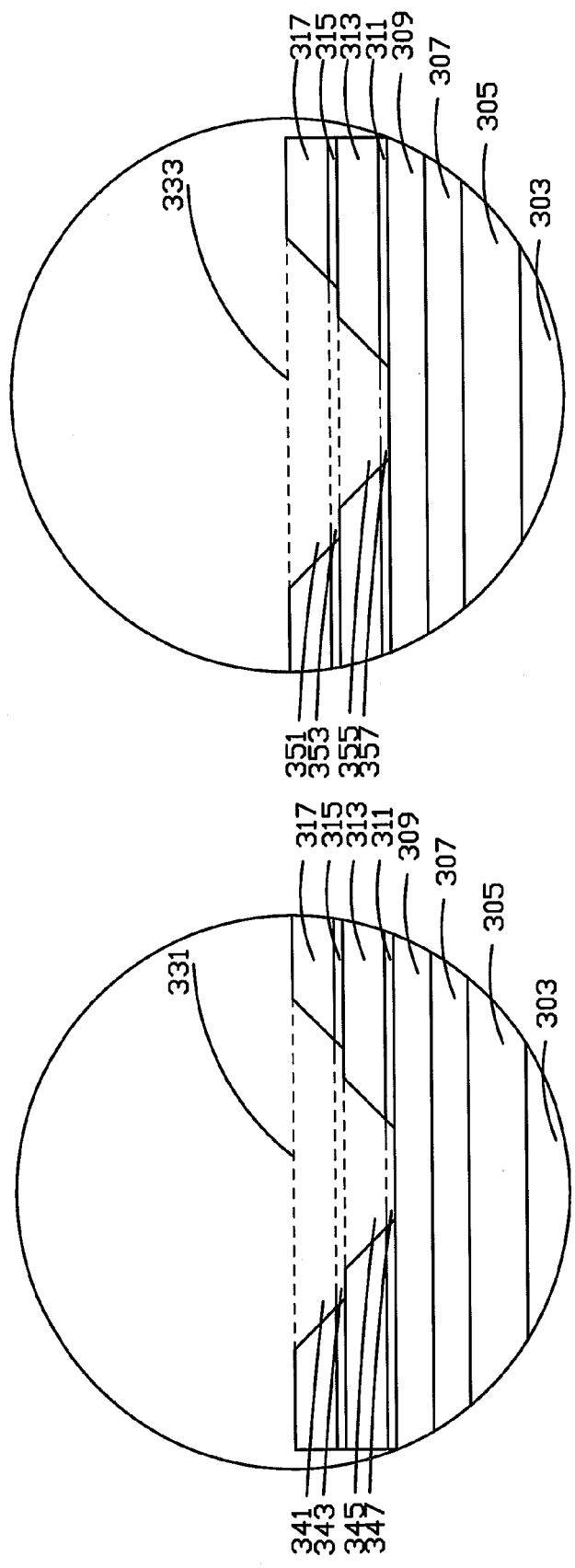

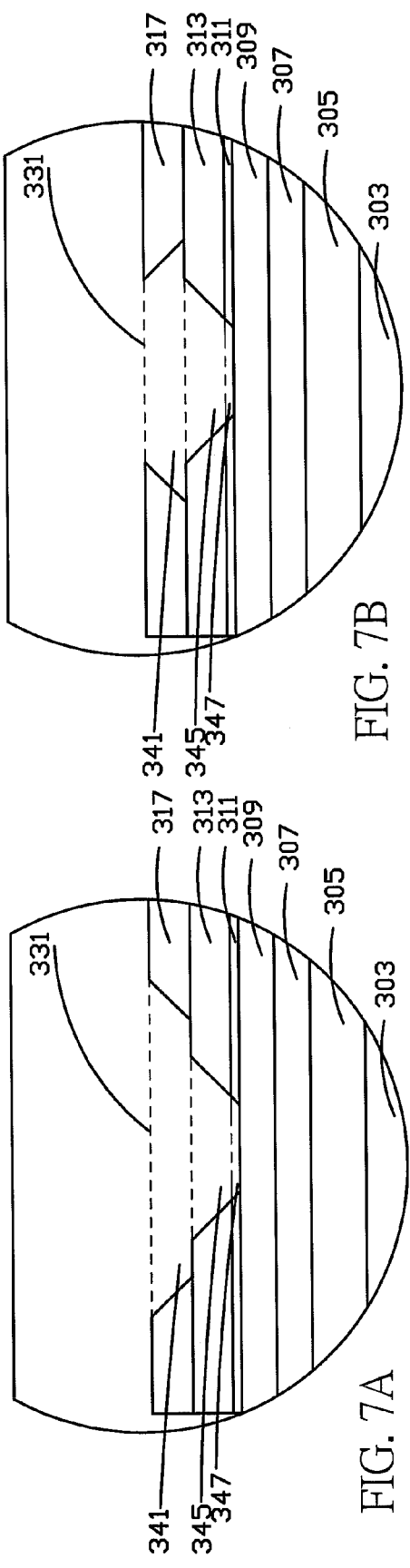
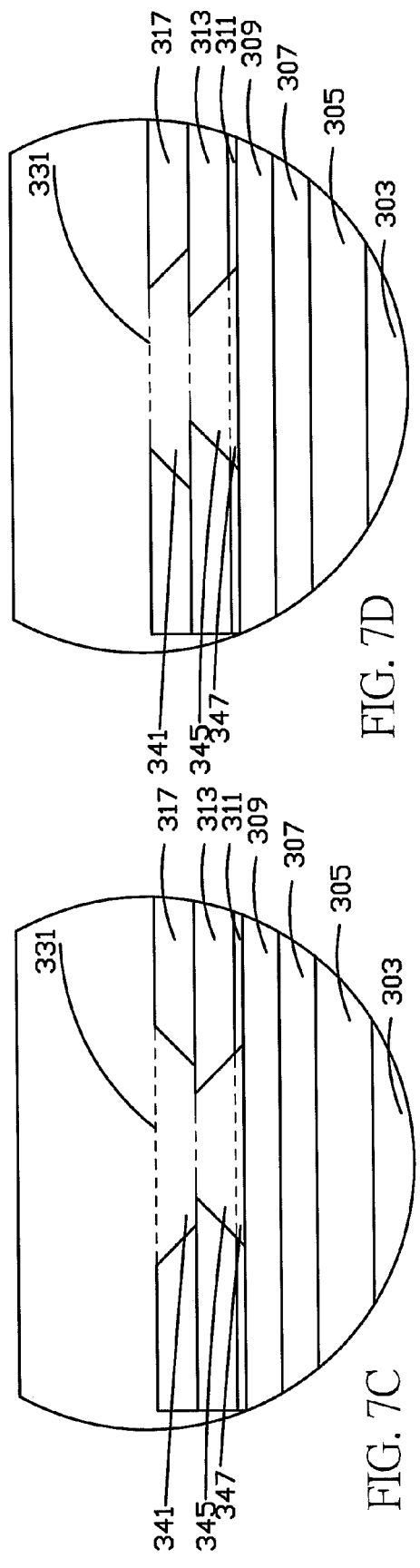
FIG. 7A  FIG. 7B  FIG. 7C  FIG. 7D

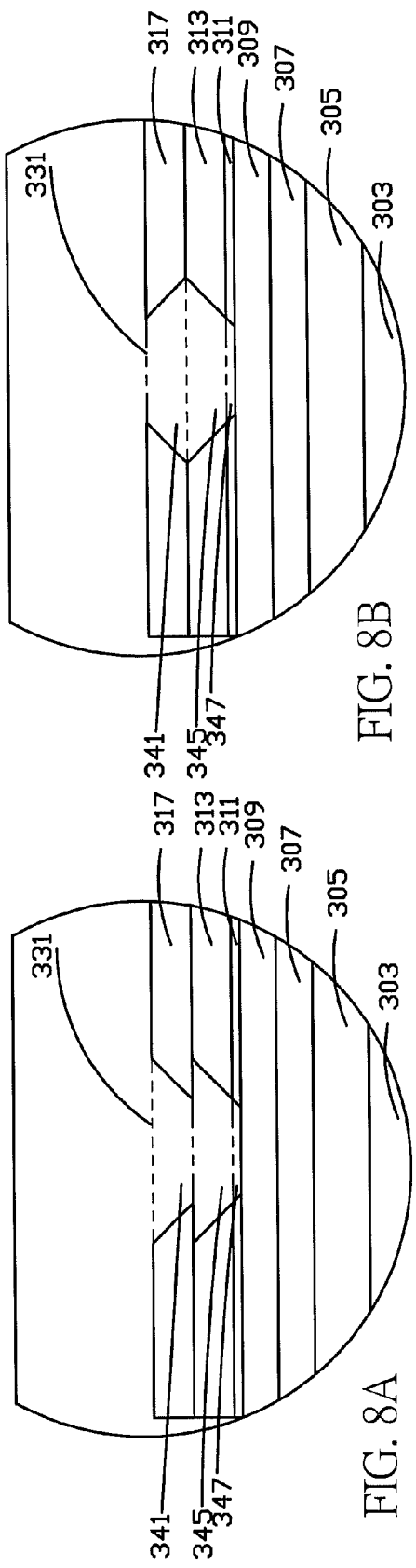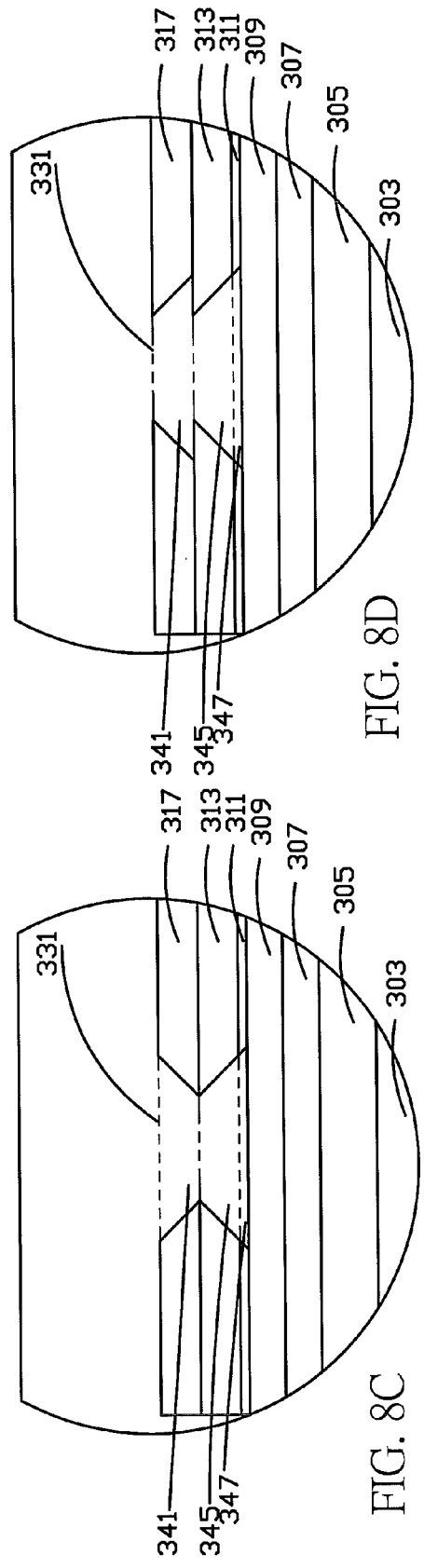

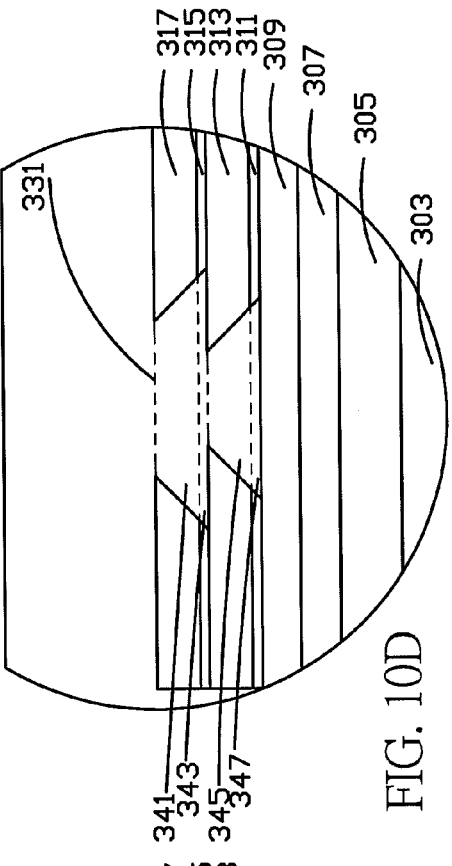
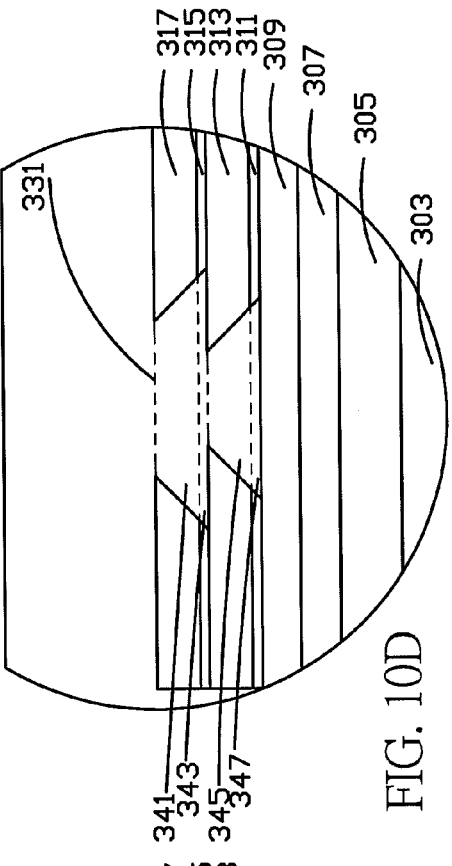
FIG. 10A  FIG. 10B
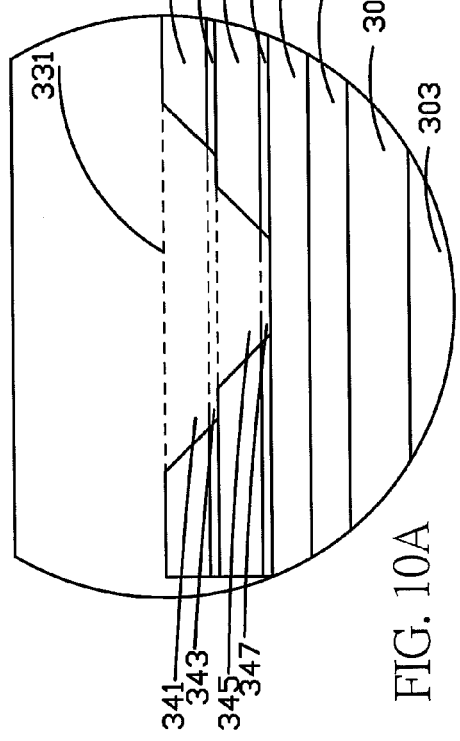
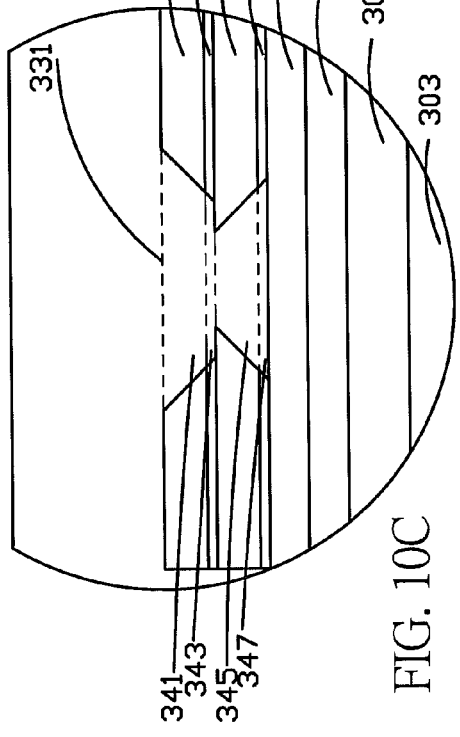
FIG. 10C  FIG. 10D

STRUCTURE OF A HIGH ELECTRON MOBILITY TRANSISTOR

FIELD OF THE INVENTION

The present invention relates to an improved high electron mobility transistor (HEMT) structure and a fabrication method thereof, in particular to an improved structure in which a first n type doped layer is formed of $Al_xGa_{1-x}As$, and a multiple selective etching process is used to fabricate the device structure so that the device have high electron mobility and low resistance at on state.

BACKGROUND OF THE INVENTION

A high electron mobility transistor (HEMT) is a commonly used device in wireless communications, such as low noise amplifiers for RF (radio frequency) signals and switch elements in integrated wireless circuits.

FIG. 1 is a cross section view for a conventional HEMT device, which comprises sequentially: a substrate 101, a channel layer 103, a spacing layer 105, a δ doped layer 107, a Schottky layer 109, a first etch stop layer 111, a first n type doped layer 113, a second etch stop layer 115, and a second n type doped layer 117. The channel layer 103 is formed epitaxially on the substrate 101. The spacing layer 105 is formed above the channel layer 103. The δ-doped layer 107 is formed above the spacing layer 105. The Schottky layer 109 is formed above the δ doped layer 107. The first etch stop layer 111 is formed above the Schottky layer 109. The first n type doped layer 113 is formed above the first etch stop layer 111, which is an n-GaAs layer. The second etch stop layer 115 is formed above the first n type doped layer 113. The second n type doped layer 117 is formed above the second etch stop layer 115, which is an n+GaAs layer. The gate recess 135 is formed and ended at the Schottky layer 109 by etching, and then a metal layer acting as the gate electrode 121 is deposited inside the gate recess 135 to form Schottky contact to the Schottky layer 109. A metal layer acting as the source electrode 123 is deposited on one end of the second n type doped layer 117 to form ohmic contacts. A metal layer acting as the drain electrode 125 is deposited on one end of the second n type doped layer 117 to form ohmic contacts. This kind of structure has been widely used in the past. The advantage of this structure is that a superior Schottky contact between the gate electrode 121 and the Schottky layer 109 can be obtained since the Schottky layer 109 is made of a medium energy gap material. However, this structure also has a drawback. When the device is at on state, it will have a large on-state resistance, $R_{on}$, due to the large difference in energy gap between the Schottky layer 109 and the second n type doped layer 117 and the first n type doped layer 113.

To overcome the drawback of large $R_{on}$, an improved HEMT structure had been developed, which is shown in FIG. 2. FIG. 2 is a cross section view for another conventional HEMT device, which comprises sequentially: a substrate 201, a buffer layer 202, a channel layer 203, a spacing layer 204, a δ-doped layer 205, a Schottky layer 206, an undoped layer 207, a etch stop layer 208, a first n type doped layer 209. The buffer layer 202 is formed above substrate 201. The channel layer 203 is formed above the buffer layer 202. The spacing layer 204 is formed above the channel layer 203. The δ-doped layer 205 is formed above the spacing layer 204. The Schottky layer 206 is formed above the δ-doped layer 205. The undoped layer 207 is formed above the Schottky layer 206, which can be formed of an undoped i-GaAs layer, an undoped i-$In_{0.5}Al_{0.5}As$ layer, or an undoped i-$In_{0.5}Ga_{0.5}As$ layer. The etch stop layer 208 is formed above the undoped layer 207. The n type doped layer 209 is formed on the etch stop layer 208, which is an n+GaAs layer. By etching, a gate recess is formed and ended at the Schottky layer 206, a source recess is formed and ended at the δ-doped layer 205, and a drain recess is formed and ended at the δ-doped layer 205. Then the gate electrode 217 is deposited inside the gate recess to form Schottky contacts to the Schottky layer 206. A metal layer acting as the source electrode 220 is deposited inside the source recess to form ohmic contacts to the δ-doped layer 205. A metal layer acting as the drain electrode 221 is deposited in the drain recess to form ohmic contacts to the δ-doped layer 205. The source electrode 220 and the drain electrode 221 can form direct contact to the n type doped layer 209, the undoped layer 207, the Schottky layer 206, and the δ-doped layer 205 through the source recess and the drain recess, such that the on-state resistance, $R_{on}$, of the device can be reduced. However, because of the material used in the undoped layer 207, and contacts to the δ-doped layer 205, the reduction of the on-state resistance $R_{on}$ is not good enough, and the application with the devices is limited.

In view of these facts and for overcoming the drawback stated above, the present invention provides an improved HEMT structure and a fabrication method thereof The devices according to the present invention not only have a low resistance $R_{on}$ at on state, but also enhance the DC-RF performance of the device. Furthermore, the fabrication process for the devices has a high stability and the fabricated devices have good reliability.

SUMMARY OF THE INVENTION

The main object of the present invention is to provide an improved HEMT structure, in which a first n type doped layer formed by $Al_xGa_{1-x}As$ compound semiconductor material, is covered on the Schottky layer. Thereby, the resistance of the HEMT device at on state can be decreased, and the DC-RF performance of the HEMT device can be enhanced. Furthermore, the fabrication process for the devices has a high stability and the fabricated devices have good reliability.

Another object of the present invention is to provide an improved HEMT structure, in which a multiple selective etching is used to etch a drain recess and a source recess. The etching of the drain recess and the source recess is terminated at the Schottky layer. A drain electrode and a source electrode are in contacted with a first and a second n type doped layers respectively, and the drain electrode and the source electrode are also in contact with the Schottky layer. In addition, the first n type doped layer can be formed by using $Al_xGa_{1-x}As$. Thereby, the resistance of the device at on state can be decreased, and the DC-RF performance of the device can be enhanced.

Another object of the present invention is to provide an improved HEMT structure, in which a multiple selective etching is used to etch a drain recess, wherein the recess in the second n type doped layer can be larger, equal, or smaller than the recess in the first n type doped layer. The multiple selective etching can also be applied to etch a source recess, wherein the recess in the second n type doped layer can be larger, equal, or smaller than the recess in the first n type doped layer, whereby the contact area of the metal of the drain electrode with the first n type doped layer can be controlled. By controlling the contact area of the metal of the drain electrode with the first and the second n type doped layers and the contact area of the metal of the source electrode with the first and the second n type doped layers, the on-state resistance and the DC-RF performance can be adjusted to meet the request of the application of devices.

Another object of the present invention is to provide a fabrication method for the improved HEMT structure, wherein the first n type doped layer can be formed of GaAs, $Al_xGa_{1-x}As$, $In_xAl_{1-x}As$, $In_xGa_{1-x}As$, or InAlGaAs, and the second n type doped layer can be formed of GaAs, $Al_xGa_{1-x}As$, $In_xAl_{1-x}As$, $In_xGa_{1-x}As$, or InAlGaAs. By using a multiple selective etching to etch a drain recess, wherein the recess in the second n type doped layer is larger than the recess in the first n type doped layer. The multiple selective etching can also be applied to etch a source recess, wherein the recess in the second n type doped layer is larger than the recess in the first n type doped layer, and therefore the contact area of the metal of the drain electrode with the first n type doped layer can be increased. The contact area of the metal of the source electrode with the first n type doped layer can be increased as well. By controlling the contact area of the metal of the drain electrode with the first and the second n type doped layers and the contact area of the metal of the source electrode with the first and the second n type doped layers, the DC-RF performance can be enhanced and the on-state resistance can be reduced.

Another object of the present invention is to provide a fabrication method for the improved HEMT structure, wherein a multiple selective etching is used, so that the fabrication process is flexible and can be performed repeatedly.

To reach the objects stated above, the present invention provides an improved HEMT structure, which comprises sequentially:
  a substrate,
  a channel layer,
  a spacing layer,
  a carrier supply layer,
  a Schottky layer,
  a first etch stop layer,
  a first n type doped layer,
  a second n type doped layer,
  a source electrode,
  a drain electrode, and
  a gate electrode;
wherein the first n type doped layer is formed of $Al_xGa_{1-x}As$; the Schottky layer is formed of a medium energy gap material; the carrier supply layer is formed of a lower energy gap material; the gate electrode is positioned in the gate recess formed by using a multiple selective etching process and forms Schottky contact to the Schottky layer; the source electrode is deposited on the source recess formed by using a multiple selective etching process and the second n type doped layer surrounding said source recess and forms ohmic contact; the form of the drain recess formed by using a multiple selective etching process can be selected to have the recess in the second n type doped layer larger, equal, or smaller than the recess in the first n type doped layer larger, and thereby the contact area of the drain electrode with the first n type doped layer.

The present invention provides an improved HEMT structure, which, based on the structure stated above, can further include a second etch stop layer inserted between the first n type doped layer and second n type doped layer.

In an embodiment, $Al_xGa_{1-x}As$ is a preferable medium energy gap material for the Schottky layer described previously, and the preferable Al content, x, is between 0.3 and 0.6. The thickness of the Schottky layer is preferably between 3.5 and 15 nm.

In an embodiment, the first n type doped layer described previously is formed preferably of $Al_xGa_{1-x}As$ with the preferable Al content, x, larger than 0 and smaller than 0.5, and the preferable thickness is larger than 0 and smaller than 100 nm.

In an embodiment, the first n etch stop layer described previously is formed preferably of AlAs or InGaP.

In an embodiment, the second n type doped layer described previously is formed preferably of GaAs, and the preferable thickness is larger than 0 and smaller than 100 nm.

In an embodiment, the second etch stop layer described previously is preferably formed of AlAs or InGaP.

To reach the objects stated above, the present invention further provides a fabrication method for an improved HEMT structure. The method is a multiple selective etching process, which comprises the following steps:
  On a substrate sequentially forming a channel layer, a spacing layer, a carrier supply layer, a Schottky layer, a first etch stop layer, a first n type doped layer, and a second n type doped layer;
  Etching the second n type doped layer to form a first gate recess, a first drain recess, and a first source recess;
  Etching the first n type doped layer to form a third gate recess, a third drain recess, and a third source recess, and the third gate recess positioned right below the first gate recess, the third drain recess positioned right below the first drain recess, and the third source recess positioned right below the first source recess;
  Etching the first etch stop layer to form a fourth gate recess, a fourth drain recess, and a fourth source recess, and the fourth gate recess positioned right below the third gate recess, the fourth drain recess positioned right below the third drain recess, and the fourth source recess positioned right below the third source recess; Thereby, a gate recess is formed by the first gate recess, the third gate recess, and the gate fourth recess stated above; a drain recess is formed by the first drain recess, the third drain recess, and the fourth drain recess stated above; and a source recess is formed by the first source recess, the third source recess, and the fourth source recess stated above;
  The present invention provides an improved HEMT structure, which, based on the structure stated above, can further include a second etch stop layer inserted between the first n type doped layer and second n type doped layer. For the disposition of the second etch stop layer, following steps for etching the second etch stop layer are added after etching the second n type doped layer and before etching the first n type doped layer: etching the second etch stop layer to form a second gate recess right below the first gate recess, a second drain recess right below the first drain recess, and a second source recess right below the first source recess; The steps for etching the first n type doped layer are adjusted to form a third gate recess right below the second gate recess, a third drain recess right below the second drain recess, and a third source recess right below the second source recess;
  A gate electrode is deposited to the gate recess above the Schottky layer and forms Schottky contact to the Schottky layer;
  A drain electrode is deposited to the drain recess and the second n type doped layer surrounding the drain recess and forms ohmic contact. The drain electrode can select to form ohmic contact to both the second n type doped layer and the first n type doped layer, or no ohmic contact to the first n type doped layer;
  A source electrode is deposited to the source recess and the second n type doped layer surrounding the source recess and forms ohmic contact. The source electrode can select to form ohmic contact to both the second n type doped layer and the first n type doped layer, or no ohmic contact to the first n type doped layer.

To reach the objects stated above, the present invention provides an improved HEMT structure, which comprises sequentially from bottom to top: a substrate, a channel layer, a spacing layer, a carrier supply layer, a Schottky layer, a first etch stop layer, a first n type doped layer, a second n type doped layer, a gate electrode, a drain electrode, a source electrode. The first n type doped layer is formed preferably of GaAs, $Al_xGa_{1-x}As$, $In_xAl_{1-x}As$, $In_xGa_{1-x}As$, or InAlGaAs; the second n type doped layer is formed preferably of GaAs, $Al_xGa_{1-x}As$, $In_xGa_{1-x}As$, $In_xGa_{1-x}As$, or InAlGaAs; the Schottky layer is formed of a medium energy gap material; the carrier supply layer is formed of a lower energy gap material; the gate electrode forms Schottky contact to the Schottky layer in the gate recess formed by using a multiple selective etching process; the source electrode is deposited to the source recess formed by using a multiple selective etching process and the second n type doped layer surrounding the source recess and forms ohmic contact; in the source recess formed by using a multiple selective etching process, the recess in the second n type doped layer can be etched larger than the recess in the first n type doped layer, such that the contact area between the source electrode and the first n type doped layer can be increased; the drain electrode is deposited to the drain recess formed by using a multiple selective etching process and the second n type doped layer surrounding the drain recess and forms ohmic contact; in the drain recess formed by using a multiple selective etching process, the recess in the second n type doped layer can be etched larger than the recess in the first n type doped layer, such that the contact area between the drain electrode and the first n type doped layer can be increased.

The present invention provides an improved HEMT structure, which, based on the structure stated above, can further include a second etch stop layer inserted between the first n type doped layer and second n type doped layer.

In an embodiment, $Al_xGa_{1-x}As$ is a preferable medium energy gap material for the Schottky layer described previously, and the preferable Al content, x, is between 0.3 and 0.6. The thickness of the Schottky layer is preferably between 3.5 and 15 nm.

In an embodiment, the first n type doped layer described previously is formed preferably of GaAs, $Al_xGa_{1-x}As$, $In_xAl_{1-x}As$, $In_xGa_{1-x}As$, or InAlGaAs with the preferable Al content x of $Al_xGa_{1-x}As$ larger than 0 and smaller than 0.5, the preferable In content x of $In_xAl_{1-x}As$ larger than 0 and smaller than 0.5, the preferable In content x of $In_xGa_{1-x}As$ larger than 0 and smaller than 0.5. The preferable thickness of the first n type doped layer is larger than 0 and smaller than 100 nm.

In an embodiment, the first etch stop layer described previously is formed preferably of AlAs or InGaP.

In an embodiment, the second n type doped layer described previously is formed preferably of GaAs, $Al_xGa_{1-x}As$, $In_xAl_{1-x}As$, $In_xGa_{1-x}As$, or InAlGaAs with the preferable Al content x of $Al_xGa_{1-x}As$ larger than 0 and smaller than 0.5, the preferable In content x of $In_xAl_{1-x}As$ larger than 0 and smaller than 0.5, the preferable In content x of $In_xGa_{1-x}As$ larger than 0 and smaller than 0.5. The preferable thickness of the second n type doped layer is larger than 0 and smaller than 100 nm.

In an embodiment, the second etch stop layer described previously is preferably formed of AlAs or InGaP.

The present invention further provides a fabrication method for the improved HEMT structure, which is a multiple selective etching process including the following steps:

Above a substrate sequentially forms a channel layer, a spacing layer, a carrier supply layer, a Schottky layer, a first etch stop layer, a first n type doped layer, and a second n type doped layer;

Etching the second n type doped layer to form a first gate recess, first drain recess, and a first source recess;

Etching the first n type doped layer to form a third gate recess, a third drain recess, and a third source recess. The third gate recess is disposed right below the first gate recess. The third drain recess is disposed right below the first drain recess, and the third drain recess is smaller than the first drain recess. The third source recess is disposed right below the first source recess, and the third source recess is smaller than the first source recess;

Etching the first etch stop layer to form a fourth gate recess, a fourth drain recess, and a fourth source recess. The fourth gate recess is disposed right below the third gate recess. The fourth drain recess is disposed right below the third drain recess. The fourth source recess is disposed right below the third source recess. Thereby, a gate recess is formed by the first gate recess, the third gate recess, and the fourth gate recess described previously; a drain recess is formed by the first drain recess, the third drain recess, and the fourth drain recess described previously; and the source recess is formed by the first source recess, the third source recess, and the fourth source recess described previously.

The present invention provides an improved HEMT structure, which, based on the structure stated above, can further include a second etch stop layer inserted between the first n type doped layer and second n type doped layer. For the disposition of the second etch stop layer, following steps for etching the second etch stop layer are added after etching the second n type doped layer and before etching the first n type doped layer: etching the second etch stop layer to form a second gate recess right below the first gate recess, a second drain recess right below the first drain recess, and a second source recess right below the first source recess; The steps for etching the first n type doped layer are adjusted to form a third gate recess right below the second gate recess, and to form a third drain recess right below the second drain recess and the third drain recess is smaller than the first drain recess, and to form a third source recess right below the second source recess and the third source recess is smaller than the first source recess;

A gate electrode is deposited to the gate recess above the Schottky layer and forms Schottky contact to the Schottky layer;

A drain electrode is deposited to the drain recess and the second n type doped layer surrounding the drain recess and forms ohmic contact. The drain electrode forms ohmic contact to both the second n type doped layer and the first n type doped layer;

A source electrode is deposited to the source recess and the second n type doped layer surrounding the source recess and forms ohmic contact. The source electrode forms ohmic contact to both the second n type doped layer and the first n type doped layer.

For further understanding the characteristics and effects of the present invention, some preferred embodiments referred to drawings are in detail described as follows.

DETAILED DESCRIPTIONS OF PREFERRED EMBODIMENTS

FIG. 3A is a structure cross-sectional view for a HEMT device according to the present invention, which comprises a substrate 301, a channel layer 303, a spacing layer 305, a carrier supply layer 307, a Schottky layer 309, a first etch stop layer 311, a first n type doped layer 313, a second n type doped layer 317, a gate electrode 321, a drain electrode 323, and a source electrode 325.

In the structure of the present invention, the substrate 301 is made preferably of semi-insulating GaAs. The channel layer 303 is formed on the semi-insulating GaAs substrate 301. The material for the channel layer 303 may be GaAs or $In_xGa_{1-x}As$. On the channel layer 303 is a modulation doped layer, which is made preferably of a medium energy gap material. In the structure of the present invention, the modulation doped layer contains the spacing layer 305, the carrier supply layer 307, and the Schottky layer 309 stated previously. The medium energy gap material is preferably $Al_xGa_{1-x}As$ with an Al content, x, larger than 0 and smaller than 0.6. On the Schottky layer 309 is covered by the first etch stop layer 311. The material for the first etch stop layer 311 is preferably AlAs or In GaP. On the first etch stop layer 311 is covered by the first n type doped layer 313. The material for the first n type doped layer 313 is preferably $Al_xGa_{1-x}As$ with an Al content, x, larger than 0 and smaller than 0.5, and the thickness of the first n type doped layer 313 is preferably larger than 0 and smaller than 100 nm. On the first n type doped layer 313 is covered by the second n type doped layer 317. The material for the second n type doped layer 317 is preferably GaAs, and the thickness of the second n type doped layer 317 is preferably larger than 0 and smaller than 100 nm.

The present invention can be fabricated by using a multiple selective etching process. The etching steps for producing the structure of the present invention are described as follows. As shown in FIG. 3A, FIG. 4A~4B, and FIG. 6A, first, the location and size of the first gate recess 361, the first drain recess 341, and the first source recess 351 are defined on the second n type doped layer 317 by using photolithography. Then, the second n type doped layer 317 is etched by using a first etching process to form the first gate recess 361, the first drain recess 341, and the first source recess 351. The first etching process can either be a wet etching or a dry etching, as long as the etching selectivity is good. In wet etching, for example, citric acid, succinic acid, or acetic acid are suitable etchants for GaAs in the first etching process, and the etching process will be terminated at the first n type doped layer 313. Then, $Al_xGa_{1-x}As$ of the first n type doped layer 313 positioned right below the first gate recess 361, the first drain recess 341, and the first source recess 351 is etched by using a second etching process to form the third gate recess 365 right below the first gate recess 361, the third drain recess 345 right below the first drain recess 341, the third source recess 355 right below the first source recess 351. The second etching process can either be a wet etching or a dry etching as well, as long as the etching selectivity is good. In wet etching, for example, citric acid, succinic acid, or acetic acid are suitable etchants for $Al_xGa_{1-x}As$ in the second etching process, and the etching process will be terminated at the first etch stop layer 311. Finally, AlAs or InGaP of the first etch stop layer 311 positioned right below the third gate recess 365, the third drain recess 345, and the third source recess 355 is etched by using a third etching process to form the fourth gate recess 367 right below the third gate recess 365, the fourth drain recess 347 right below the third drain recess 345, the fourth source recess 357 right below the third source recess 355. The third etching process can either be a wet etching or a dry etching as well, as long as the etching selectivity is good. In wet etching, for example, $NH_4OH$, $H_2O_2$, or HCl solution are suitable etchants for AlAs, and HCl solution is suitable etchant for InGaP in the third etching process. The etching process will be terminated at the Schottky layer 309. After performing the three selective etching processes, a gate recess 335, a drain recess 331, and a source 333 are formed, in which the gate recess 335 consists of the first gate recess 361, the third gate recess 365, and the fourth gate recess 367; the drain recess 331 consists of the first drain recess 341, the third drain recess 345, and the fourth drain recess 347; the source recess 355 consists of the first source recess 351, the third source recess 355, and the fourth source recess 357. Afterwards the gate electrode 321 is deposited to the gate recess 335 above the Schottky layer 309 to form Schottky contact to the Schottky layer 309. The drain electrode 323 is deposited to the drain recess 331 and above the second n type doped layer 317 surrounding the drain recess 331 to form ohmic contact. Finally, the source electrode 325 is deposited to the drain recess 333 and above the second n type doped layer 317 surrounding the source recess 333 to form ohmic contact.

Another embodiment of the present invention is as shown in FIG. 3B, FIG. 5A~5B, and FIG. 6B. A second etch stop layer 315 can be inserted between the second n type doped layer 317 and the first n type doped layer 313 shown in FIG. 3A described above. The material for the second etch stop layer 315 is preferably AlAs or InGaP. Because of the disposition of the second etch stop layer 315, a fourth etching process is required after etching the second n type doped layer 317 and before etching the first n type doped layer 313, and the etching process for etching the first n type doped layer 313 needs to be adjusted. The fourth etching process is for etching the second etch stop layer 315, comprising the following steps: etching AlAs or InGaP of the second etch stop layer 315 right below the first gate recess 361, the first drain recess 341, and the first source recess 351 to form a second gate recess 363 right below the first gate recess 361, a second drain recess 343 right below the first drain recess 341, and a second source recess 353 right below the first source recess 351. The fourth etching process can either be a wet etching or a dry etching as well, as long as the etching selectivity is good. In wet etching, for example, $NH_4OH$, $H_2O_2$, or HCl solution are suitable etchants for AlAs, and HCl solution is suitable etchant for InGaP in the fourth etching process. The etching process will be terminated at the first n type doped layer 313. The second etching process for etching the first n type doped layer 313 is adjusted to etch $Al_xGa_{1-x}As$ of the first n type doped layer 313 positioned right below the second gate recess 363, the second drain recess 343, and the second source recess 353 to form the third gate recess 365 right below the second gate recess 363, the third drain recess 345 right below the second drain recess 343, the third source recess 355 right below the second source recess 353.

In the etching process of the drain recess 331 and the source recess 333, different etching structure can be formed with different choice of etchant solution, crystal orientation, etc. As shown in FIG. 7A~7D, FIG. 8A~8D, FIG. 9A~9D, FIG. 10A~10D, FIG. 11A~11D, and FIG. 12A~12D, the six sets of figures are enlarged figures of part of the drain recess 331, showing various possible variations of the structure of the drain recess 331. Wherein the recess of the drain recess 331 in the second n type doped layer 317 is the first drain recess 341, and the recess of the drain recess 331 in the first n type doped layer 313 is the third drain recess 345. By controlling the choice of etchant solution, crystal orientation, etc. not only various structure can be etched, but also the relative size of the first drain recess 341 and the third drain recess 345 can be controlled. As shown in FIG. 7A~7D, FIG. 10A~10D, the first drain recess 341 is larger than the third drain recess 345; as shown in FIG. 9A~9D, FIG. 12A~12D, the first drain recess 341 is smaller than the third drain recess 345; as shown in FIG. 8A~8D, FIG. 11A~11D, the first drain recess 341 is equal to the third drain recess 345. Similarly, the recess in the second n type doped layer 317 of the source recess 333 can be selected to be larger than, equal to, or smaller than the recess in the first n type doped layer 313 of the source recess 333. Wherein the recess of the source recess 333 in the second n type doped layer 317 is the first source recess 351, and the recess of the source recess 333 in the first n type doped layer 313 is the first source recess 355. When depositing a metal layer on the drain recess 331, the relative size of the first drain recess 341 and the third drain recess 345 is related to the size of the contact area between the drain metal and the first n type doped layer 313, and between the drain metal and the second n type doped layer 317. Similarly, when depositing a metal layer on the source recess 333, the relative size of the first source recess 351 and the third source recess 355 is related to the size of the contact area between the source metal and the first n type doped layer 313, and between the source metal and the second n type doped layer 317. By controlling the contact area between the drain metal and the first n type doped layer 313, the second n type doped layer 317, and the Schottky layer 309, and by controlling the contact area between the source metal and the first n type doped layer 313, the second n type doped layer 317, and the Schottky layer 309, the DF-RF performance of the HEMT of the present invention can be adjusted, and the on-state resistance can be decreased.

Another embodiment of the present invention is as shown in FIG. 13A, a structure cross-sectional view of a HEMT device according to the present invention, which comprises a substrate 401, a channel layer 403, a spacing layer 405, a carrier supply layer 407, a Schottky layer 409, a first etch stop layer 411, a first n type doped layer 413, a second n type doped layer 417, a gate electrode 421, a drain electrode 423, and a source electrode 425.

In the structure of the present invention, the substrate 401 is made preferably of semi-insulating GaAs. The channel layer 403 is formed on the semi-insulating GaAs substrate 401. The material for the channel layer 403 may be GaAs or $In_xGa_{1-x}As$. On the channel layer 403 is a modulation doped layer, which is made preferably of a medium energy gap material. In the structure of the present invention, the modulation doped layer contains the spacing layer 405, the carrier supply layer 407, and the Schottky layer 409 stated previously. The medium energy gap material is preferably $Al_xGa_{1-x}As$ with an Al content, x, larger than 0 and smaller than 0.6. On the Schottky layer 409 is covered by the first etch stop layer 411. The material for the first etch stop layer 411 is preferably AlAs or In GaP. On the first etch stop layer 411 is covered by the first n type doped layer 413. The material for the first n type doped layer 413 is preferably GaAs, $Al_xGa_{1-x}As$, $In_xGa_{1-x}As$, or $InAlGa_xAs$, with an Al content x of $Al_xGa_{1-x}As$ larger than 0 and smaller than 0.5, an In content x of $In_xAl_{1-x}As$ larger than 0 and smaller than 0.5, and an In content x of $In_xGa_{1-x}As$ larger than 0 and smaller than 0.5. The thickness of the first n type doped layer 413 is preferably larger than 0 and smaller than smaller than 100 nm. On the first n type doped layer 413 is covered by the second n type doped layer 417. The material for the second n type doped layer 417 is preferably GaAs, $Al_xGa_{1-x}As$, or $InAlGa_xAs$, with an Al content x of $Al_xGa_{1-x}As$ larger than 0 and smaller than 0.5, an In content x of $In_xAl_{1-x}As$ larger than 0 and smaller than 0.5, and an In content x of $In_xGa_{1-x}As$ larger than 0 and smaller than 0.5. The thickness of the second n type doped layer 417 is preferably larger than 0 and smaller than 100 nm.

The present invention can be fabricated by using a multiple selective etching process. The etching steps for producing the structure of the present invention are described as follows. As shown in FIG. 13A, FIG. 14A~14B, and FIG. 16A, first, the location and size of the first gate recess 461, the first drain recess 441, and the first source recess 451 are defined on the second n type doped layer 417 by using photolithography. Then, the second n type doped layer 417 is etched by using a first etching process to form the first gate recess 461, the first drain recess 441, and the first source recess 451. The first etching process can either be a wet etching or a dry etching, as long as the etching selectivity is good. The etching process will be terminated at the first n type doped layer 413. Then, the first n type doped layer 413 positioned right below the first gate recess 461, the first drain recess 441, and the first source recess 451 is etched by using a second etching process to form the third gate recess 465 right below the first gate recess 461, the third drain recess 445 right below the first drain recess 441, in which the third drain recess 445 is smaller than the first drain recess 441, and the third source recess 455 right below the first source recess 451, in which the third source recess 455 is smaller than the first source recess 451. The second etching process can either be a wet etching or a dry etching as well, as long as the etching selectivity is good. The etching process will be terminated at the first etch stop layer 411. Finally, AlAs or InGaP of the first etch stop layer 411 positioned right below the third gate recess 465, the third drain recess 445, and the third source recess 455 is etched by using a third etching process to form the fourth gate recess 467 right below the third gate recess 465, the fourth drain recess 447 right below the third drain recess 445, and the fourth source recess 457 right below the third source recess 455. The third etching process can either be a wet etching or a dry etching as well, as long as the etching selectivity is good. In wet etching, for example, $NH_4OH$, $H_2O_2$, or HCl solution are suitable etchants for AlAs, and HCl solution is suitable etchant for InGaP in the third etching process. The etching process will be terminated at the Schottky layer 409. After performing the three selective etching processes, a gate recess 445, a drain recess 441, and a source 433 are formed, in which the gate recess 435 consists of the first gate recess 461, the third gate recess 465, and the fourth gate recess 467; the drain recess 431 consists of the first drain recess 441, the third drain recess 445, and the fourth drain recess 447; the source recess 455 consists of the first source recess 451, the third source recess 455, and the fourth source recess 457. Afterwards the gate electrode 421 is deposited to the gate recess 435 above the Schottky layer 409 to form Schottky contact to the Schottky layer 409. The drain electrode 423 is deposited to the drain recess 431 and above the second n type doped layer 417 surrounding the drain recess 431 to form ohmic contact. Finally, the source electrode 425 is deposited to the drain recess 433 and above the second n type doped layer 417 surrounding the source recess 433 to form ohmic contact.

Another embodiment of the present invention is as shown in FIG. 13B, FIG. 15A~15B, and FIG. 16B. A second etch stop layer 415 can be inserted between the second n type doped layer 417 and the first n type doped layer 413 shown in FIG. 13A described above. The material for the second etch stop layer 415 is preferably AlAs or InGaP. Because of the disposition of the second etch stop layer 415, a fourth etching process is required after etching the second n type doped layer 417 and before etching the first n type doped layer 413, and the etching process for etching the first n type doped layer 413 needs to be adjusted. The fourth etching process is for etching the second etch stop layer 415, comprising the following steps: etching AlAs or InGaP of the second etch stop layer 415 right below the first gate recess 461, the first drain recess 441, and the first source recess 451 to form a second gate recess 463 right below the first gate recess 461, a second drain recess 443 right below the first drain recess 441, and a second source recess 453 right below the first source recess 451. The fourth etching process can either be a wet etching or a dry etching as well, as long as the etching selectivity is good. In wet etching, for example, $NH_4OH$, $H_2O_2$, or HCl solution are suitable etchants for AlAs, and HCl solution is suitable etchant for InGaP in the fourth etching process. The etching process will be terminated at the first n type doped layer 413. The second etching process for etching the first n type doped layer 413 is adjusted to etch the first n type doped layer 413 positioned right below the second gate recess 463, the second drain recess 443, and the second source recess 453 to form the third gate recess 465 right below the second gate recess 463, the third drain recess 445 right below the second drain recess 443, wherein the third drain recess 445 is smaller than the first drain recess 441, the third source recess 455 right below the second source recess 453, wherein the third source recess 455 is smaller than the first source recess 451.

In the etching process of the drain recess 431 and the source recess 433, different etching structure can be formed with different choice of etchant solution, crystal orientation, etc. As shown in FIG. 17A~17D, FIG. 18A~18D, FIG. 19A~19B, FIG. 20A 20D, and FIG. 21A~21D the five sets of figures are enlarged figures of part of the drain recess 431, showing various possible variations of the structure of the drain recess 431, wherein the recess of the drain recess 431 in the second n type doped layer 417 is the first drain recess 441, and the recess of the drain recess 431 in the first n type doped layer 413 is the third drain recess 445. By controlling the choice of etchant solution, crystal orientation, etc. not only various structure can be etched, but also the relative size of the first drain recess 441 and the third drain recess 445 can be controlled. The present embodiment emphasized on the condition that the first drain recess 441 is larger than the third drain recess 445. As shown in FIG. 17A~17D, FIG. 18A~18D, FIG. 19A~19B, FIG. 20A~20D, and FIG. 21A~21D, in all these five sets of figures the first drain recess 441 is larger than the third drain recess 445. Similarly, the recess in the second n type doped layer 417 of the source recess 433 can be selected to be larger than the recess in the first n type doped layer 413 of the source recess 433. Wherein the recess of the source recess 433 in the second n type doped layer 417 is the first source recess 451, and the recess of the source recess 433 in the first n type doped layer 413 is the first source recess 455. When depositing a metal layer on the drain recess 431, the relative size of the first drain recess 441 and the third drain recess 445 is related to the size of the contact area between the drain metal and the first n type doped layer 413, and between the drain metal and the second n type doped layer 417. Similarly, when depositing a metal layer on the source recess 433, the relative size of the first source recess 451 and the third source recess 455 is related to the size of the contact area between the source metal and the first n type doped layer 413, and between the source metal and the second n type doped layer 417. By controlling the contact area between the drain metal and the first n type doped layer 413, the second n type doped layer 417, and the Schottky layer 409, and by controlling the contact area between the source metal and the first n type doped layer 413, the second n type doped layer 417, and the Schottky layer 409. When the first drain recess 441 is larger than the third drain recess 445 and the first source recess 451 is larger than the third source recess 455, the metal of the drain electrode can have contact to the first n type doped layer 413 and the second n type doped layer 417 at the same time, and the metal of the source electrode can have contact to the first n type doped layer 413 and the second n type doped layer 417 at the same time, such that the DF-RF performance of the HEMT of the present invention can be improved, and the on-state resistance can be reduced.

FIG. 22 is a plot showing the differences of the efficiency between the HEMT of the present invention and the HEMT of the previous technology, in which lines with the label EP163E042#4 are the efficiency of the HEMT of the previous technology when the voltage between the drain and the source electrode is 17~18.7 Volt, and lines with the label AP163E042#2 are the efficiency of the HEMT of the present invention when the voltage between the drain and the source electrode is 20.5 Volt. Comparing the output power (Pout), gain, and the power-added efficiency (PAE %), one can easily see that the performance of the HEMT of the present invention is superior to the HEMT of the previous technology.

To sum up, the present invention indeed can get its anticipatory object that is to provide a HEMT structure, in which a first n type doped layer formed by $Al_xGa_{1-x}As$ is covered on a Schottky layer, and drain recess and a source recess are etched, so that the drain electrode can have contact to the first and the second n type doped layer, and the first n type doped layer and the Schottky layer at the same time, and the source electrode can have contact to the second n type doped layer, the first n type doped layer, and the Schottky layer at the same time. Thereby the device on-state resistance can be decreased while the DC-RF performance can be enhanced. Furthermore, the fabrication process for the devices has a high stability and the fabricated devices have good reliability.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

BRIEF DESCRIPTION OF DRAWINGS

FIGS. 4A~4B and 5A~5B are schematics showing the cross-sectional views of the drain recess and the source recess of the structure for a HEMT device according to the present invention.

FIGS. 7A~7D, 8A~8D, 9A~9D, 10A~10D, 11A~11D, and 12A~12D are schematics showing several cross-sectional views of the drain recess of the structure for a HEMT device according to the present invention.

Figure 1:
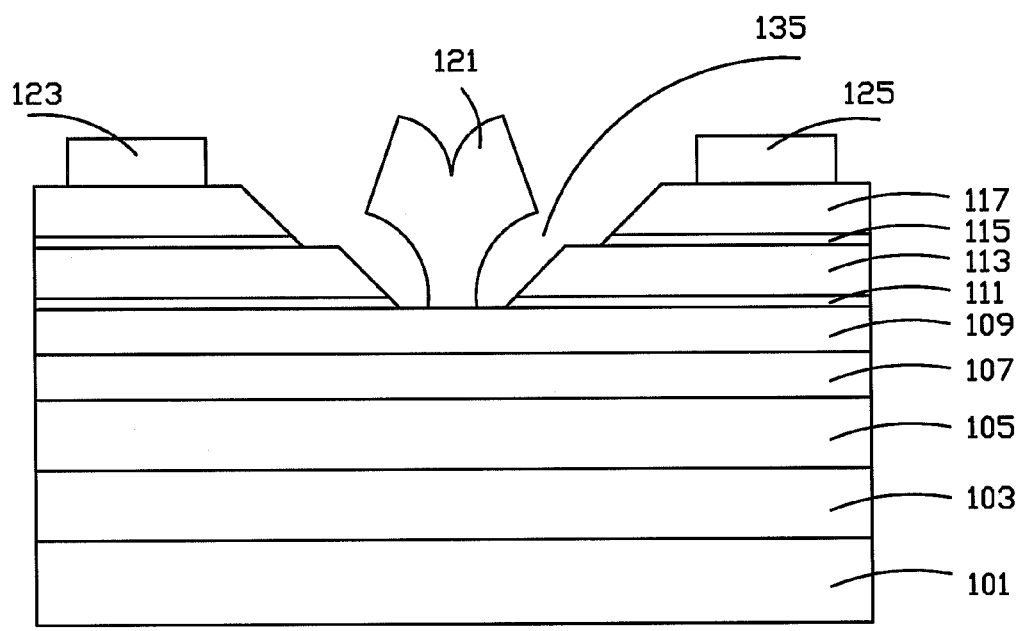
FIG. 1 is a schematic showing the cross-sectional view of the structure for a conventional HEMT device.
Figure 2:
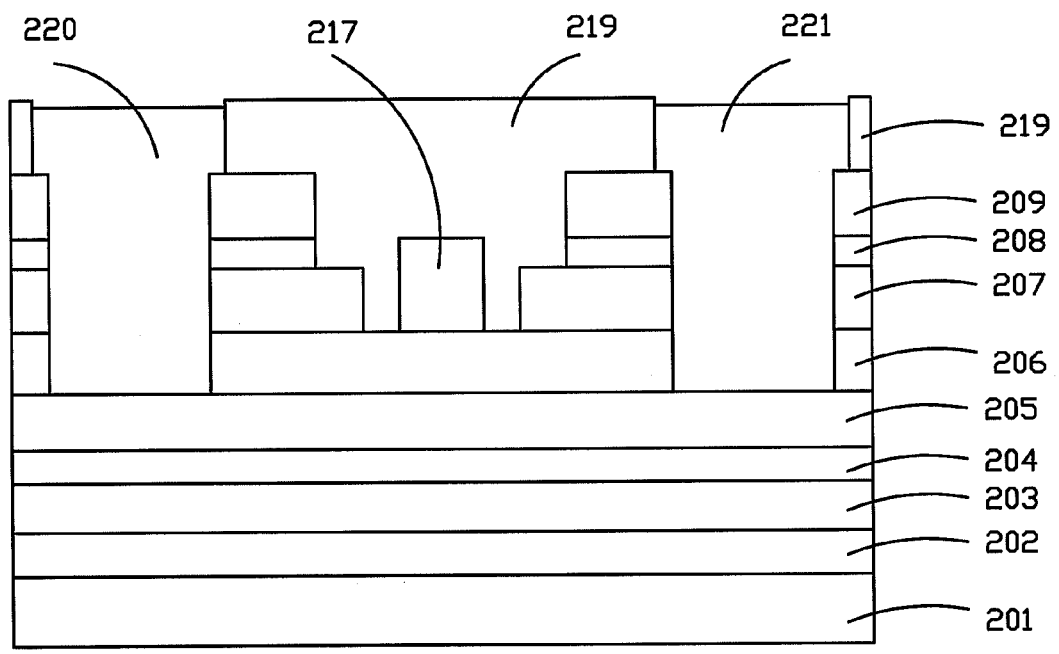
FIG. 2 is a schematic showing the cross-sectional view of the structure for another conventional HEMT device.
Figure 3A:
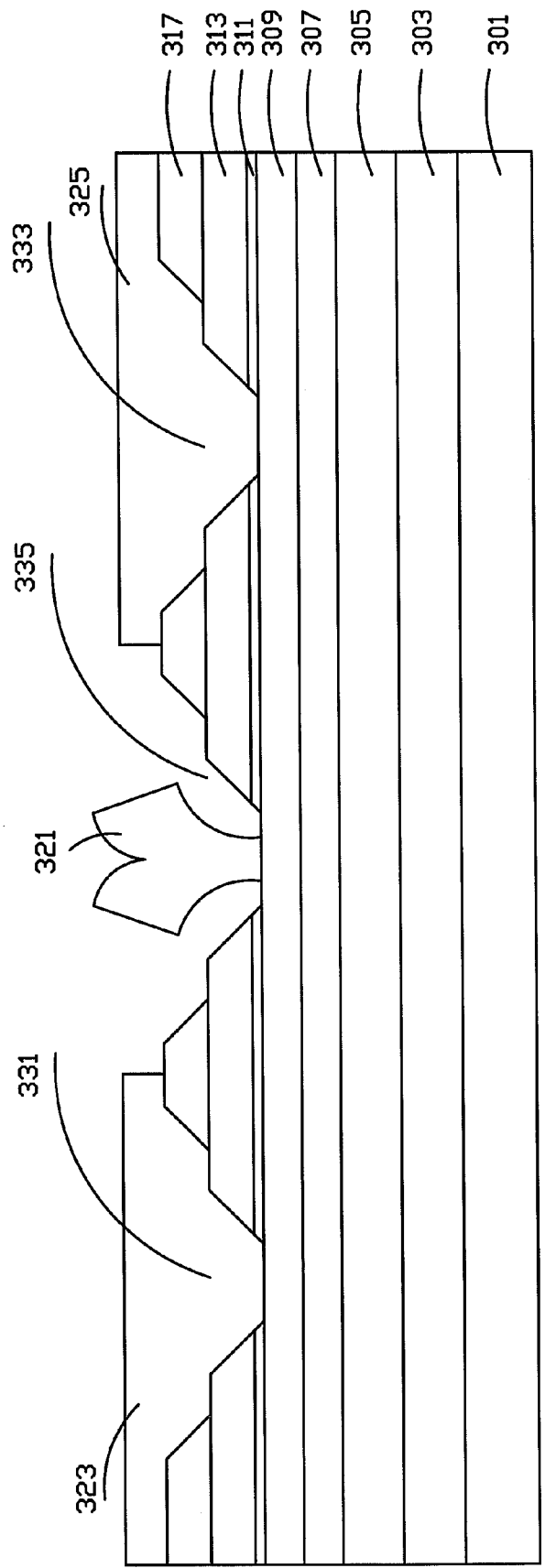
FIG. 3A is a schematic showing the cross-sectional view of the structure for a HEMT device according to the present invention.
Figure 3:
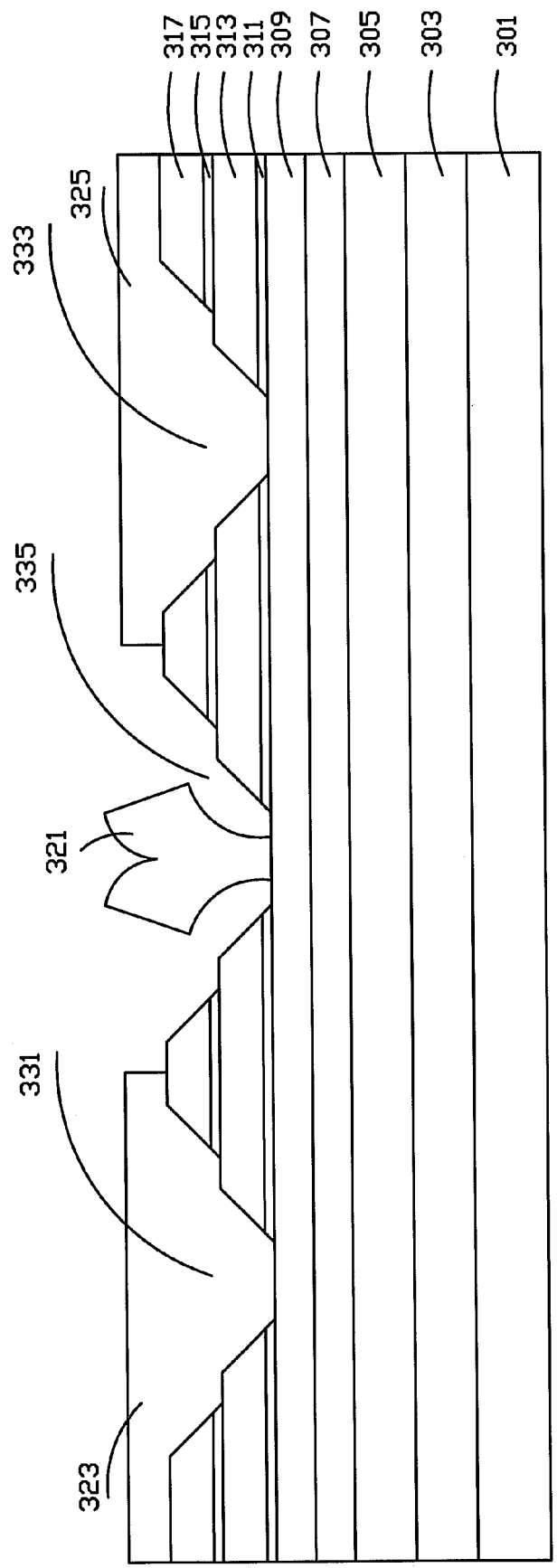
FIG. 3B is a schematic showing the cross-sectional view of the structure for a HEMT device according to another embodiment of the present invention.
Figure 6B:
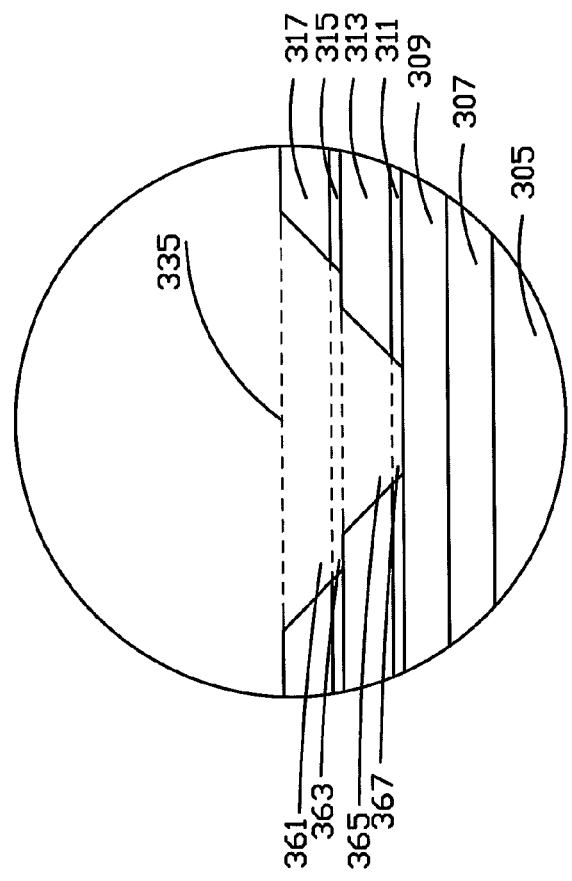
FIG. 6A~6B are schematics showing the cross-sectional views of the gate recess of the structure for a HEMT device according to the present invention.
Figure 6A:
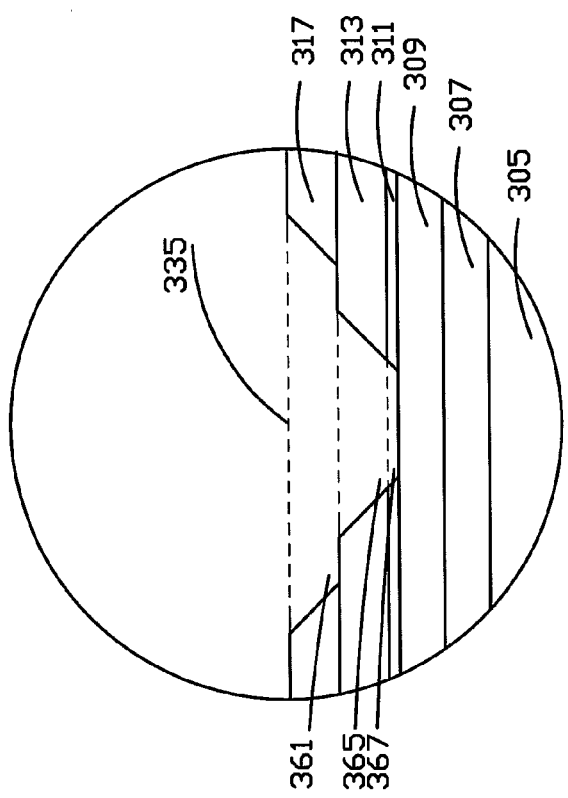
Figure 9B:
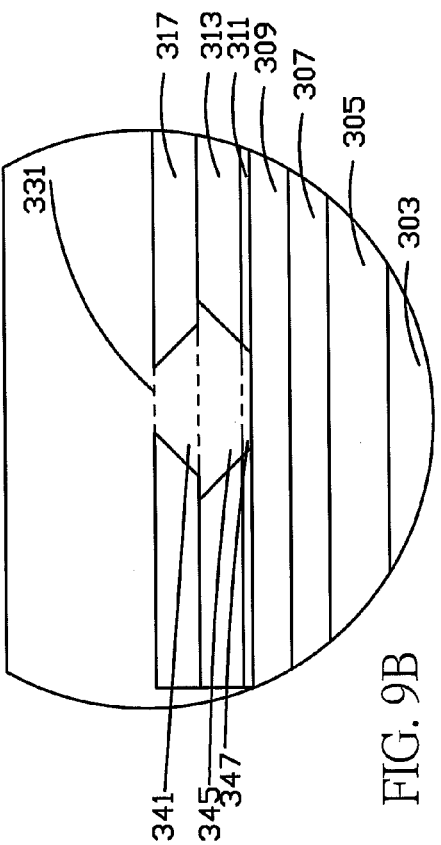
Figure 9D:
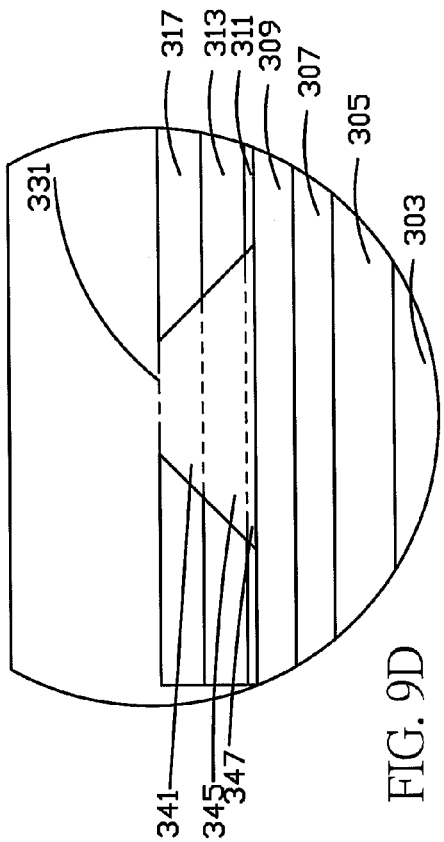
Figure 9A:
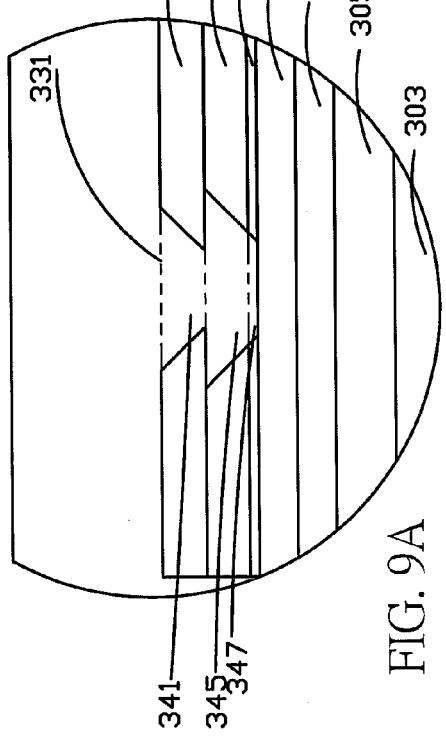
Figure 9C:
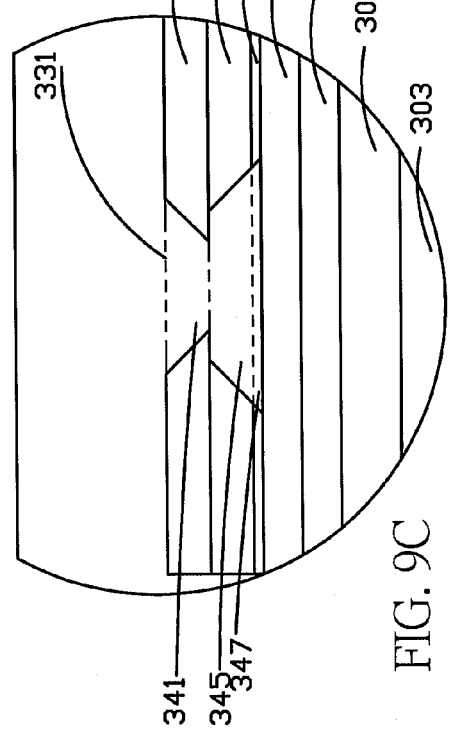
Figure 11A:
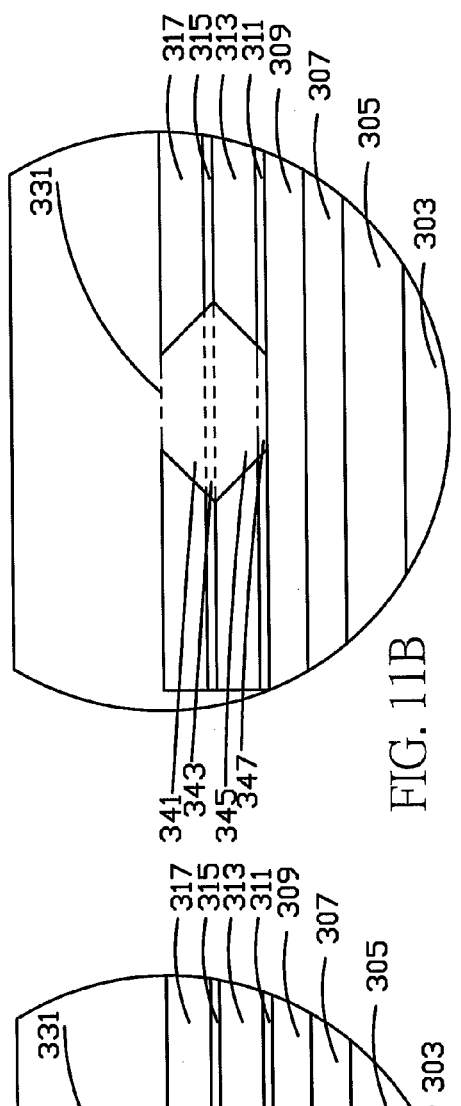
Figure 11B:
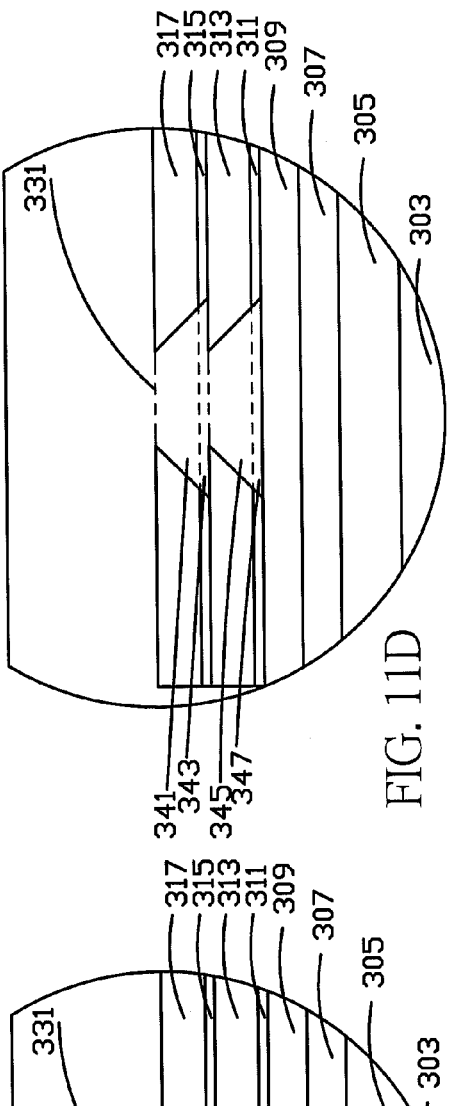
Figure 11C:
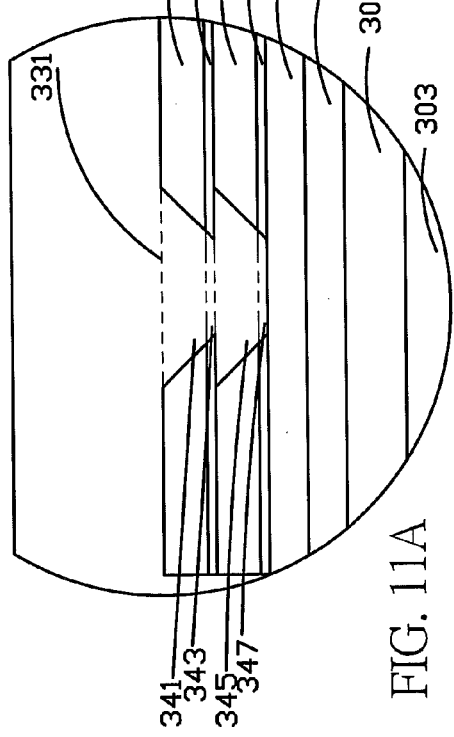
Figure 11D:
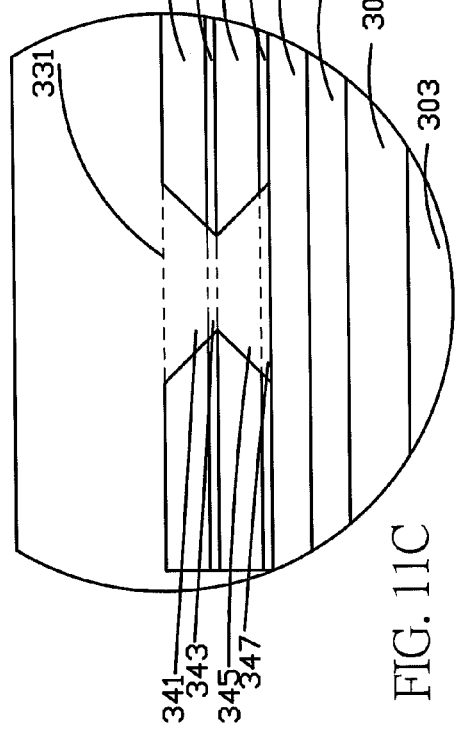
Figure 12A:
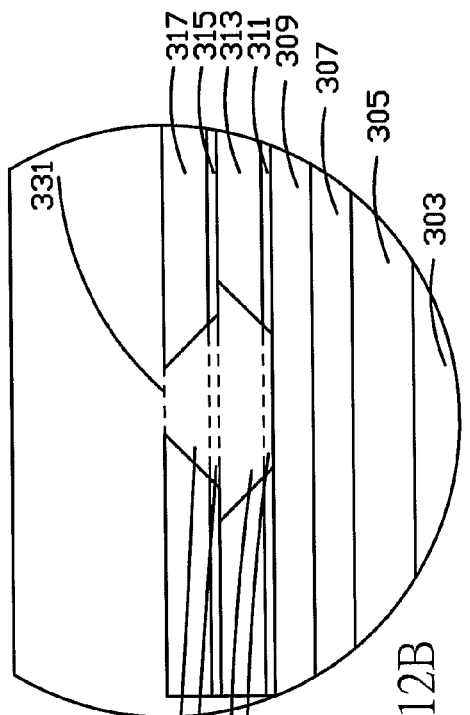
Figure 12B:
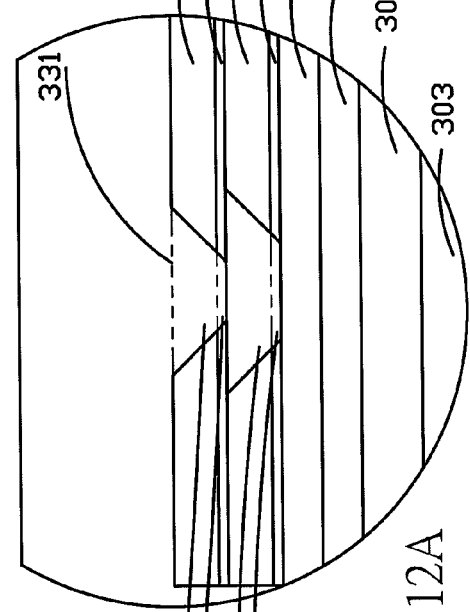
Figure 12C:
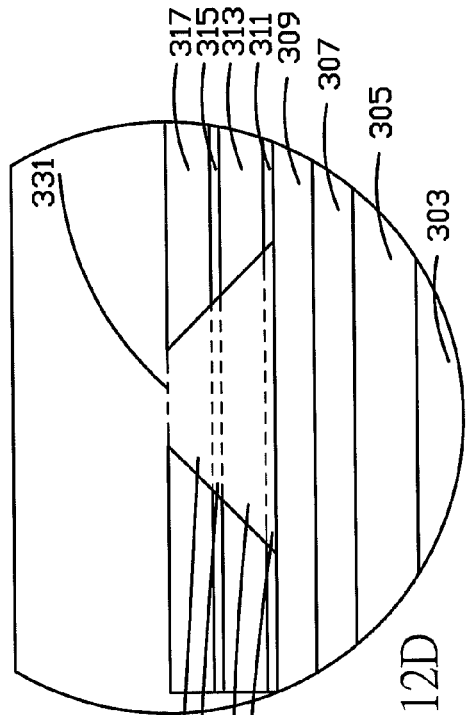
Figure 12D:
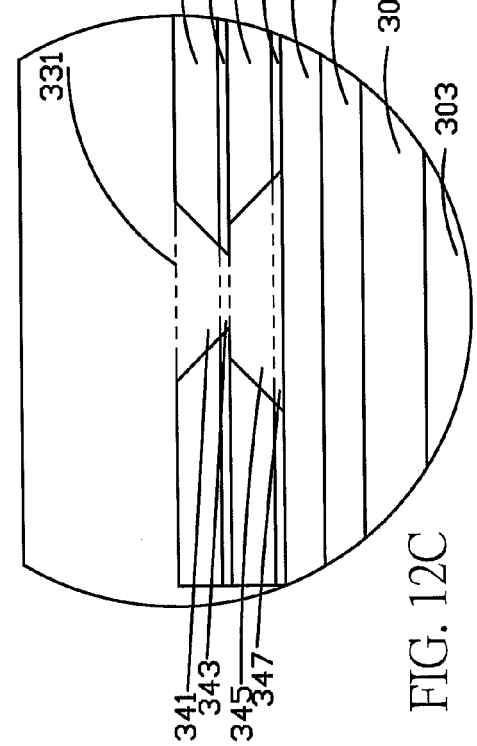
Figure 13A:
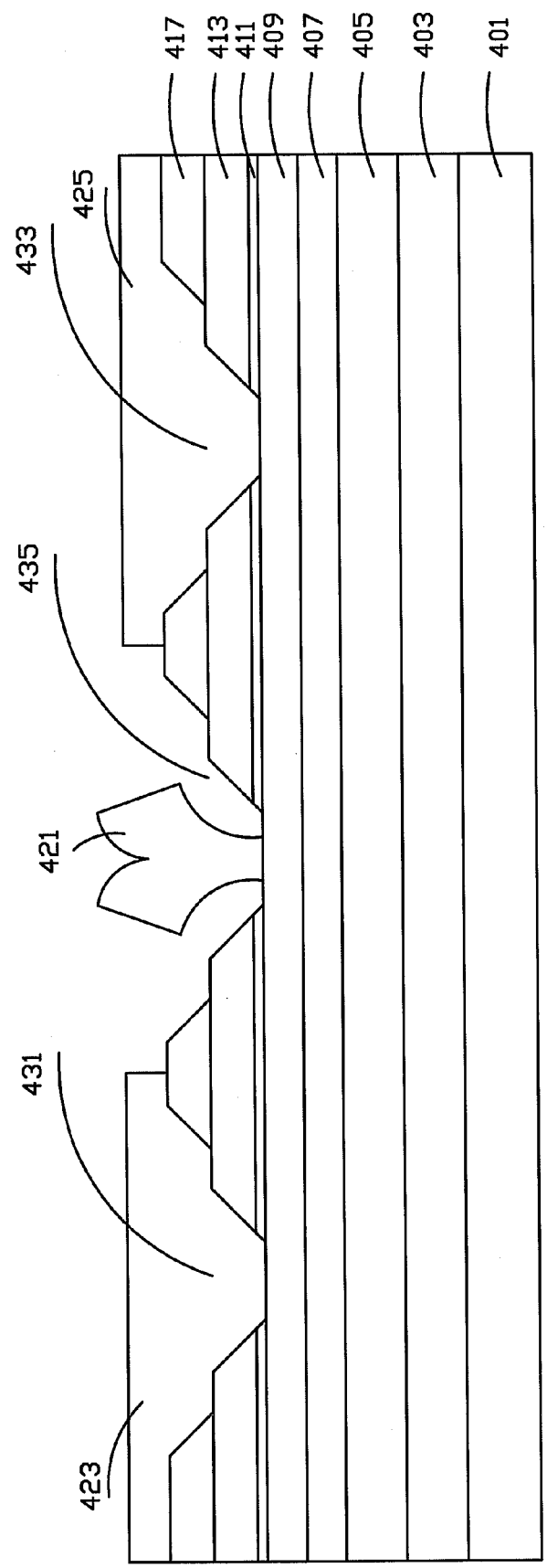
FIG. 13A is a schematic showing the cross-sectional view of the structure for a HEMT device according to another embodiment of the present invention.
Figure 13:
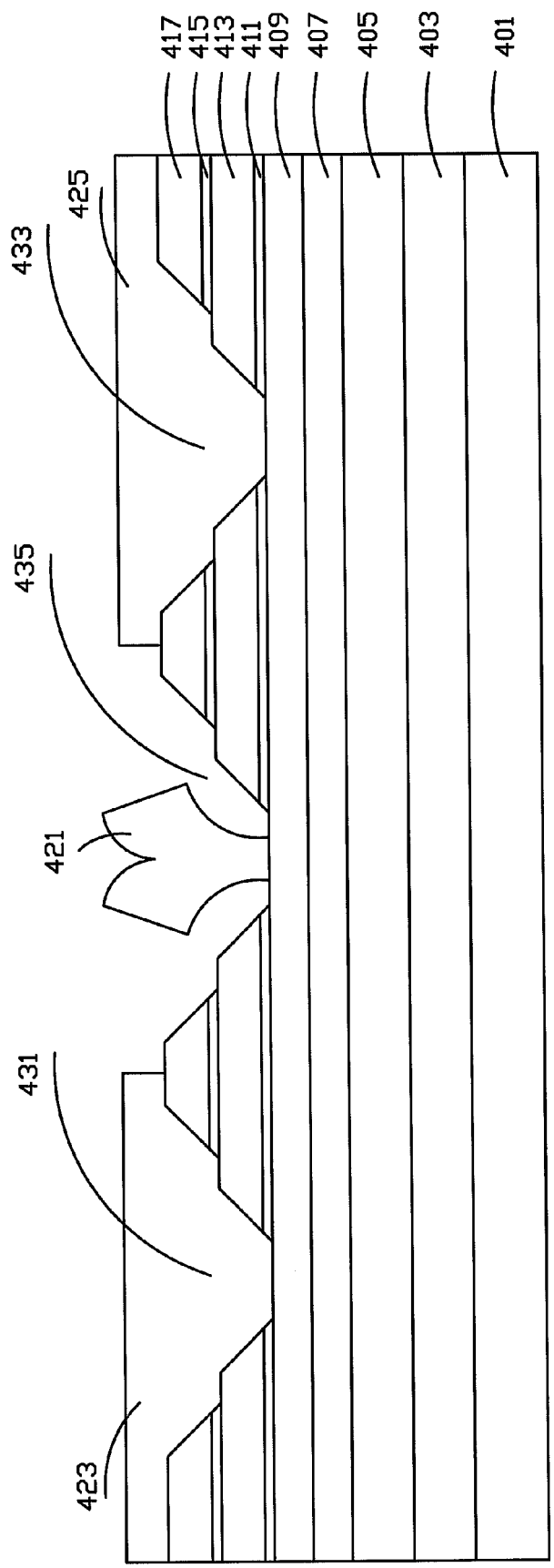
FIG. 13B is a schematic showing the cross-sectional view of the structure for a HEMT device according to another embodiment of the present invention.
Figure 14B:
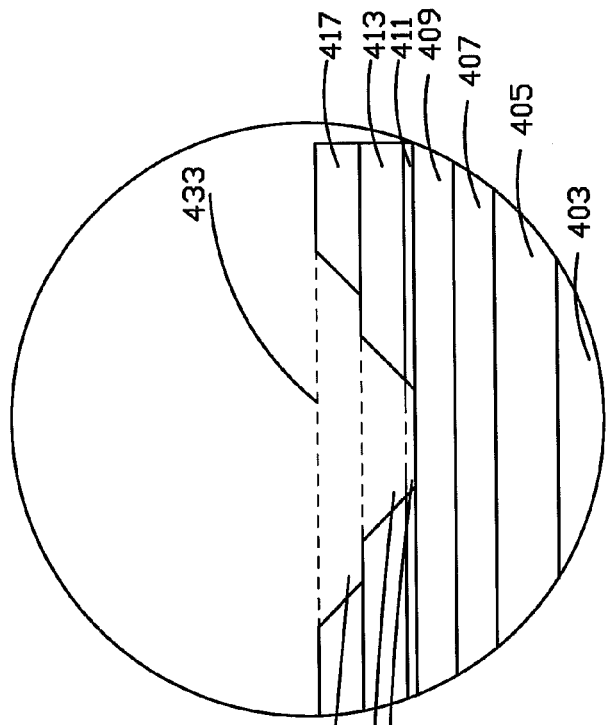
FIGS. 14A~14B and 15A~15B are schematics showing the cross-sectional views of the drain recess and the source recess of the structure for a HEMT device according to the present invention.
Figure 14A:
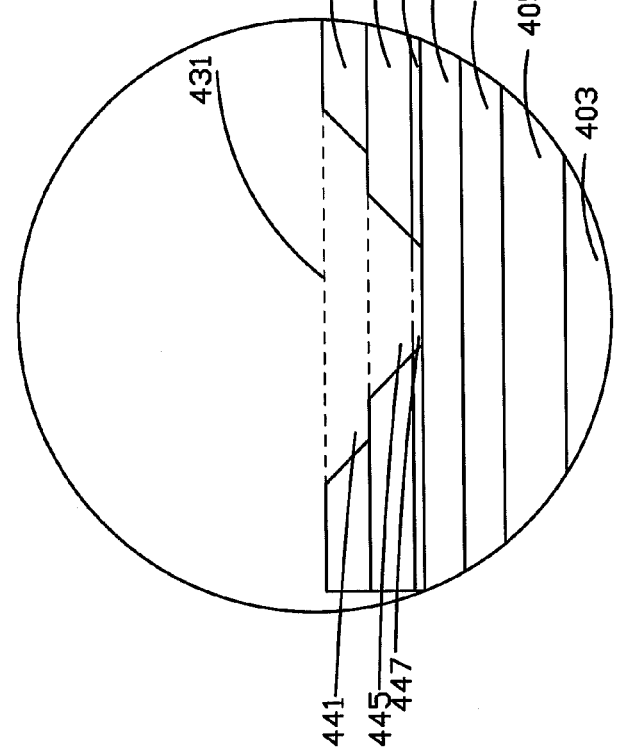
Figures 15A, 15B:
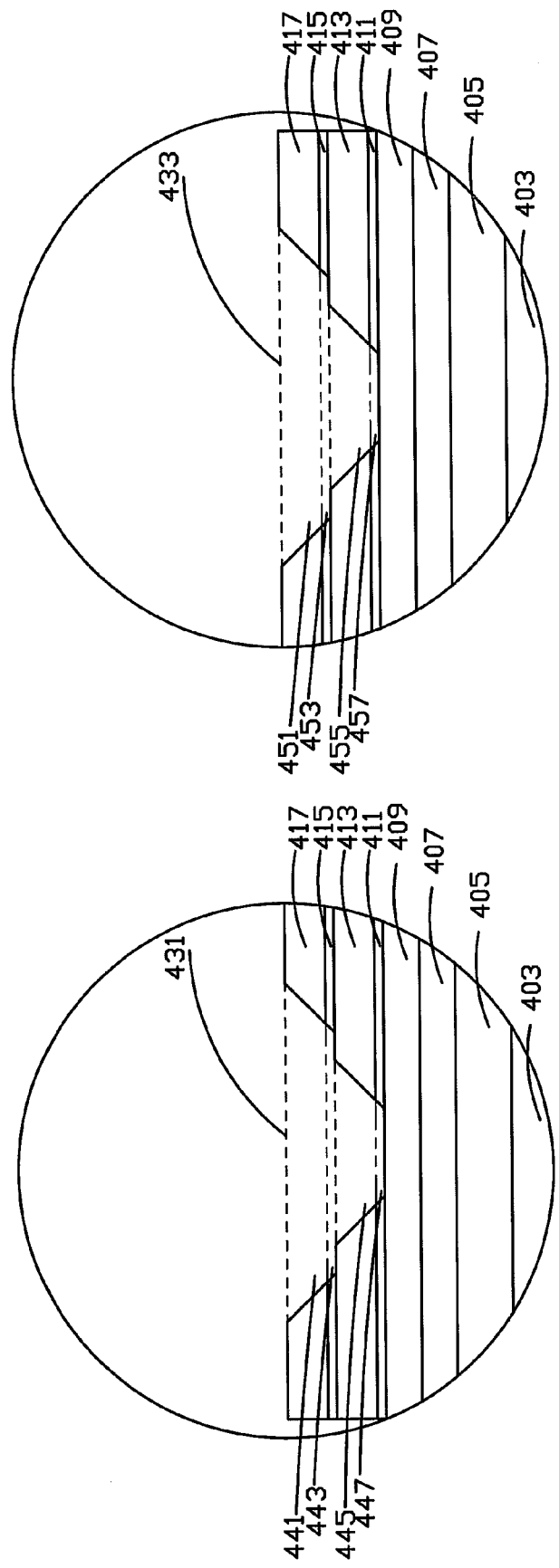
Figure 16A:
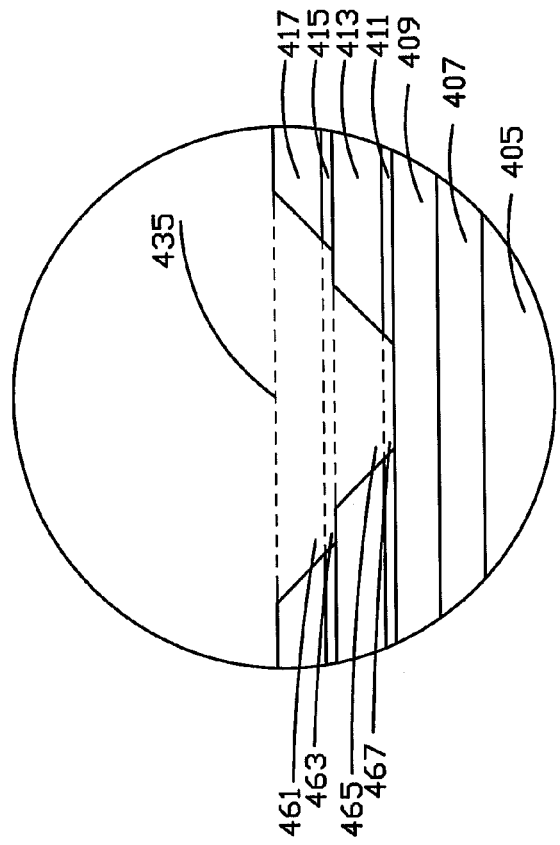
FIG. 16A~16B is a schematic showing the cross-sectional view of the gate recess of the structure for a HEMT device according to the present invention.
Figure 16B:
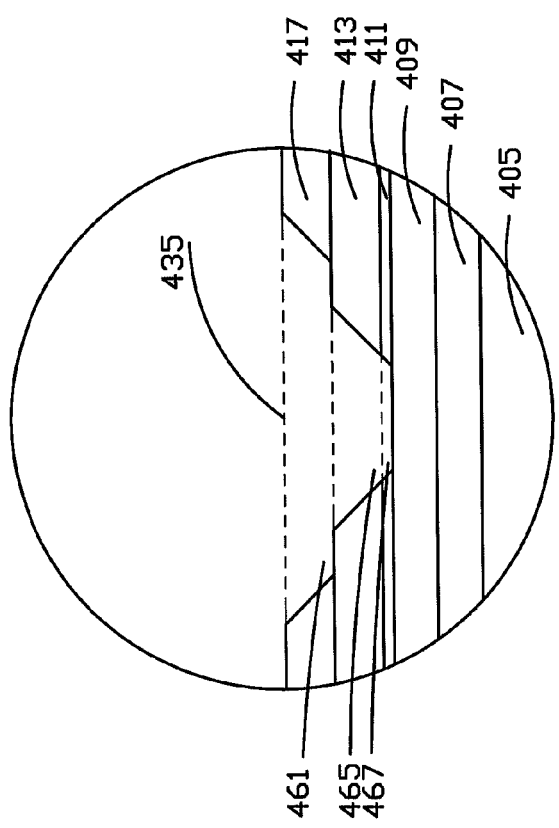
Figure 17B:
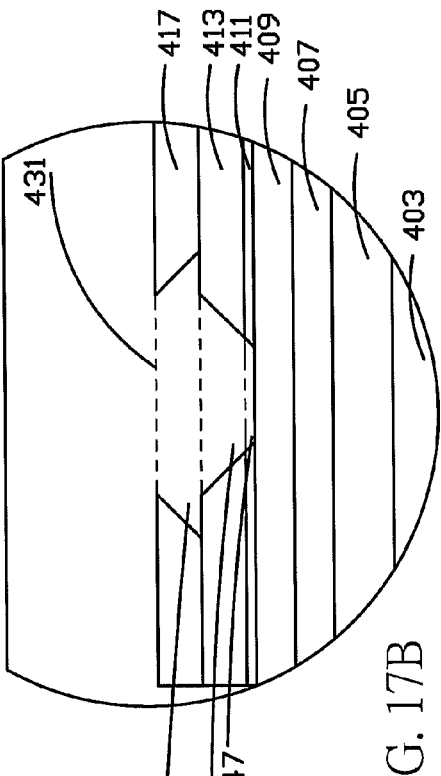
FIG. 17A~17D, 18A~18D, 19A~19B, 20A~20D, 21A~21D are schematics showing several cross-sectional views of the drain recess of the structure for a HEMT device according to the present invention.
Figure 17D:
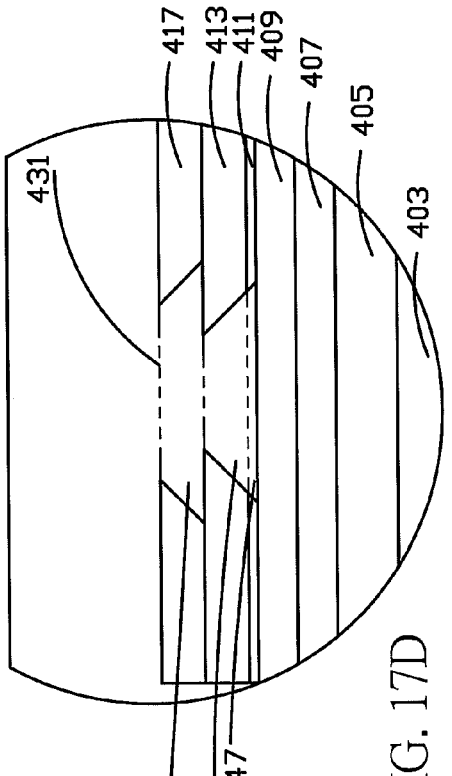
Figure 17A:
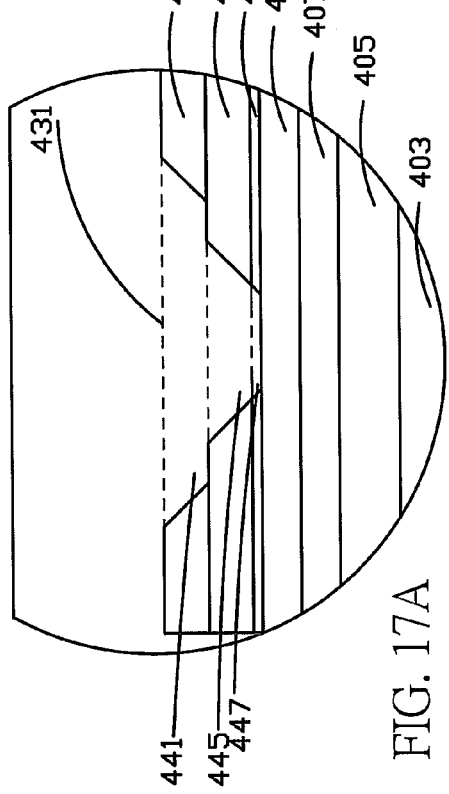
Figure 17C:
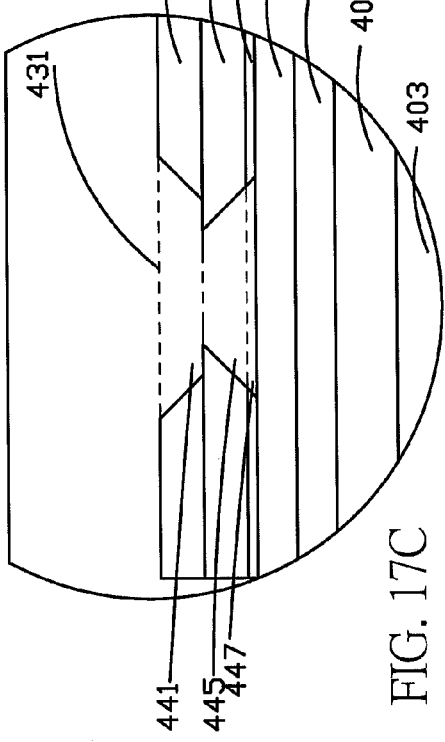
Figure 18A:
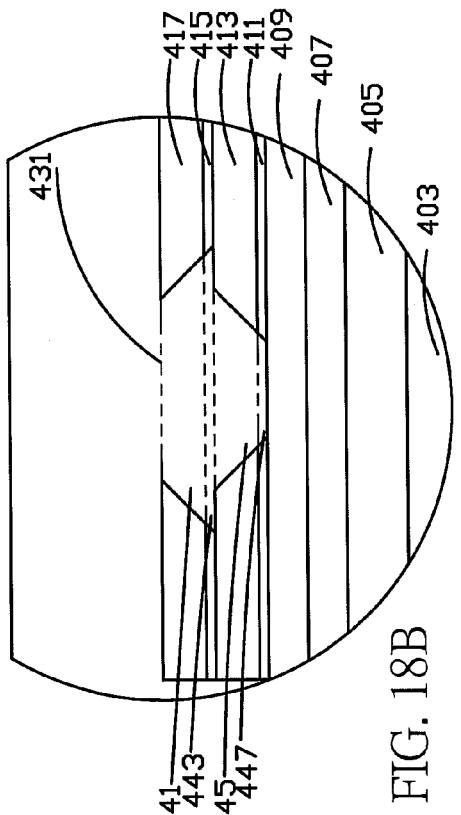
Figure 18B:
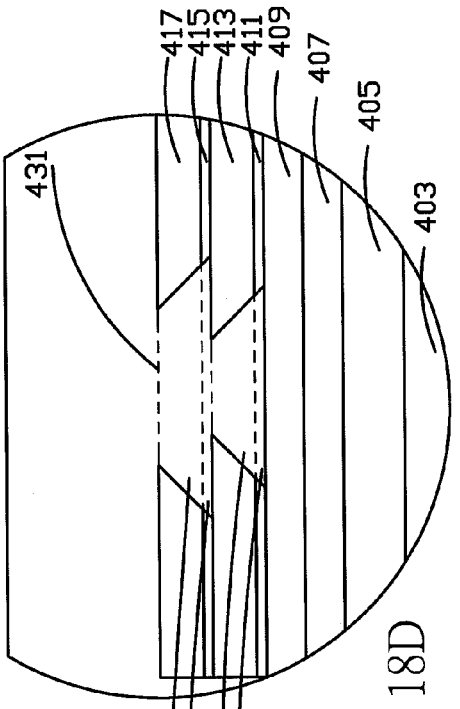
Figure 18C:
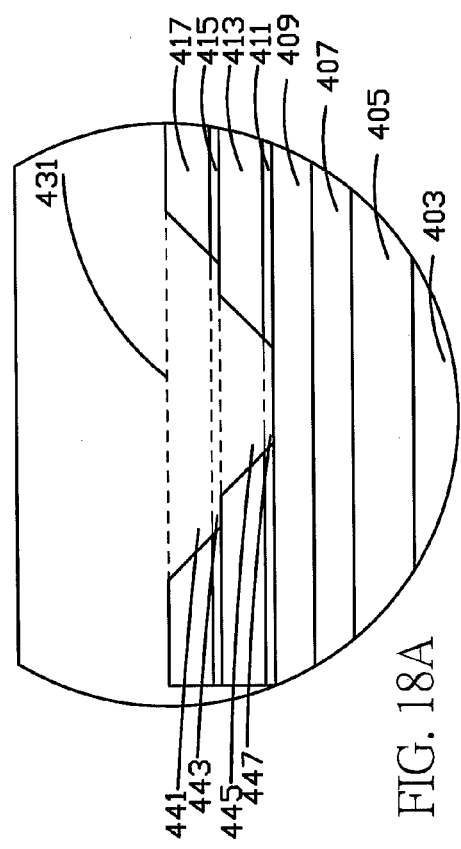
Figure 18D:
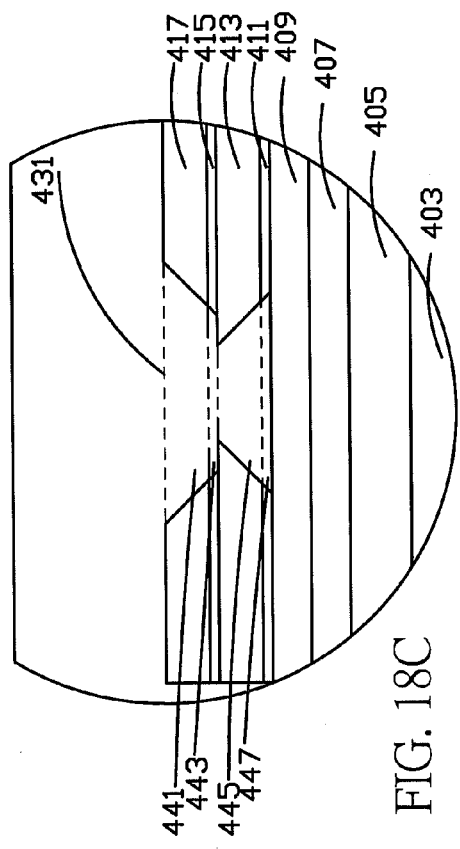
Figure 19B:
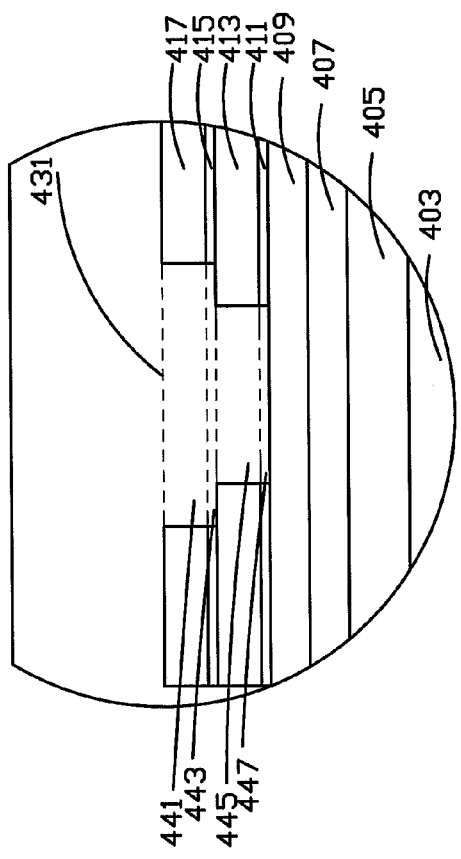
Figure 19A:
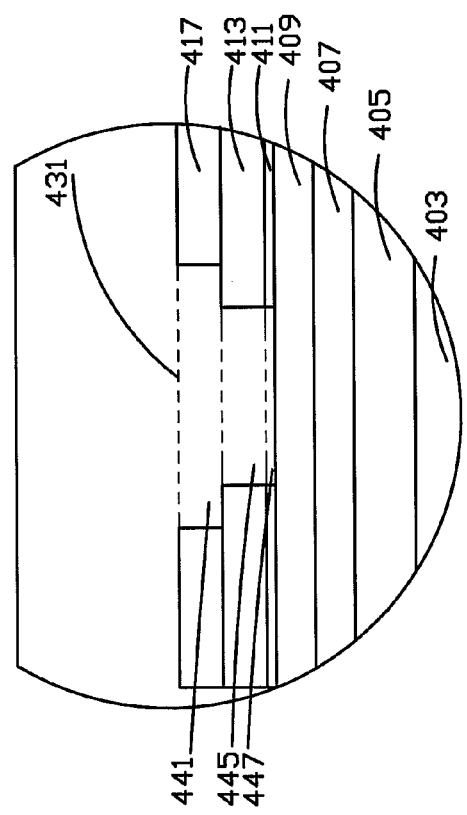
Figure 20A:
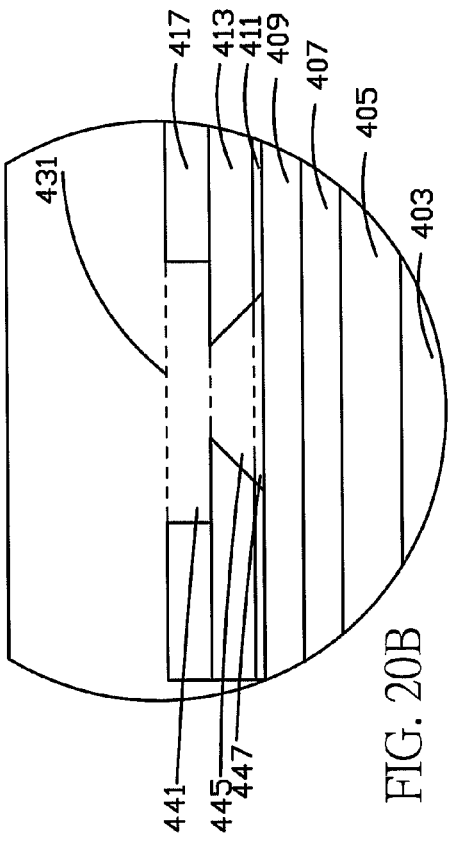
Figure 20C:
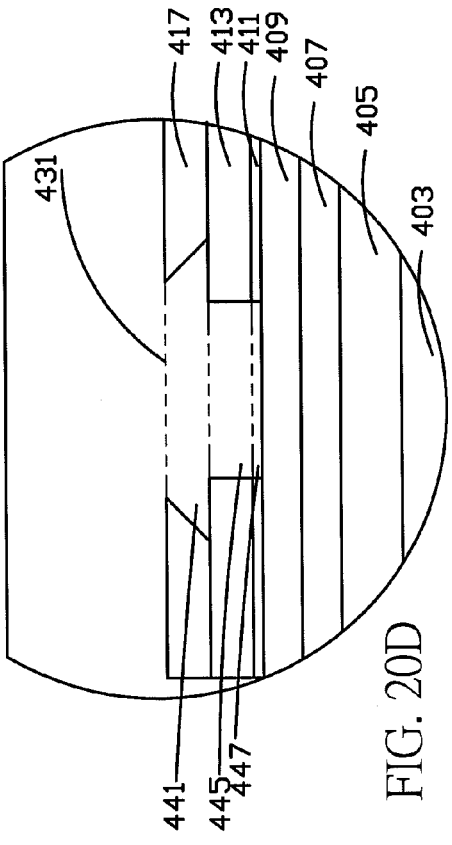
Figure 20B:
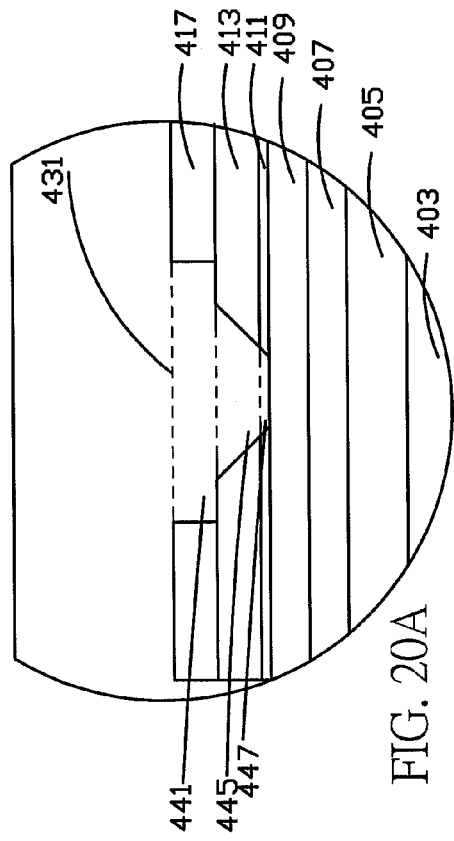
Figure 20D:
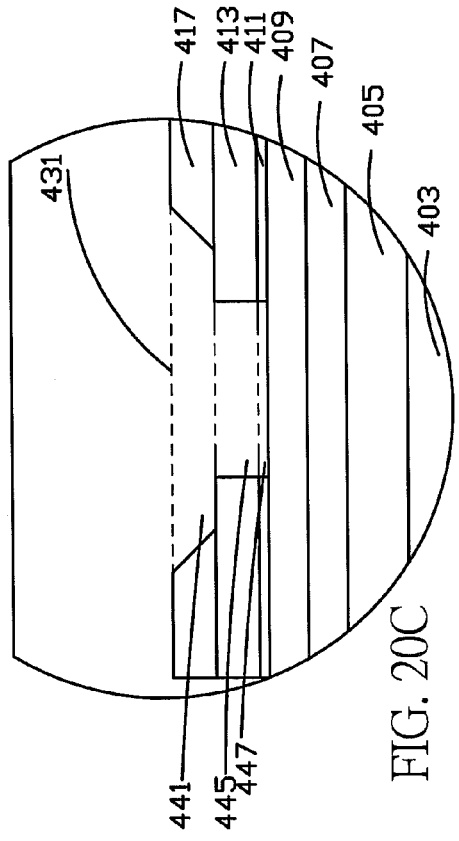
Figure 21A:
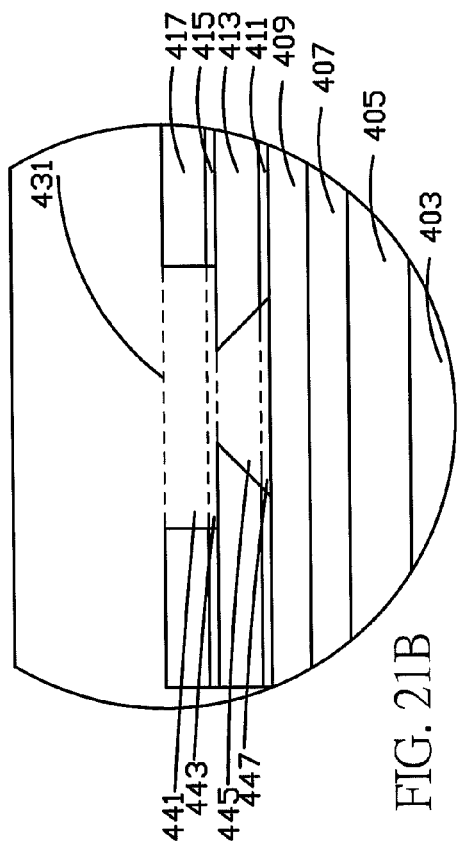
Figure 21B:
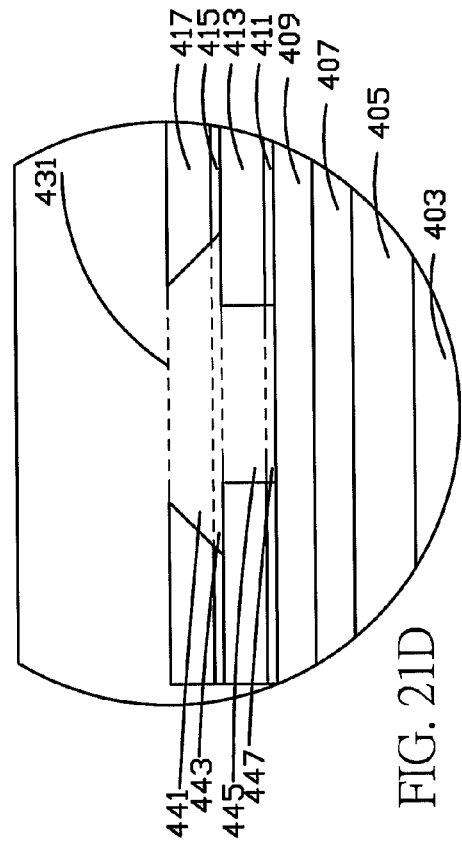
Figure 21C:
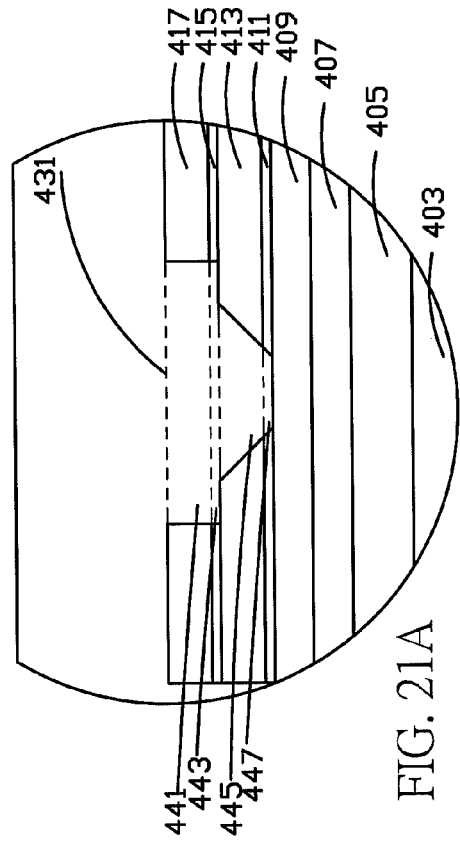
Figure 21D:
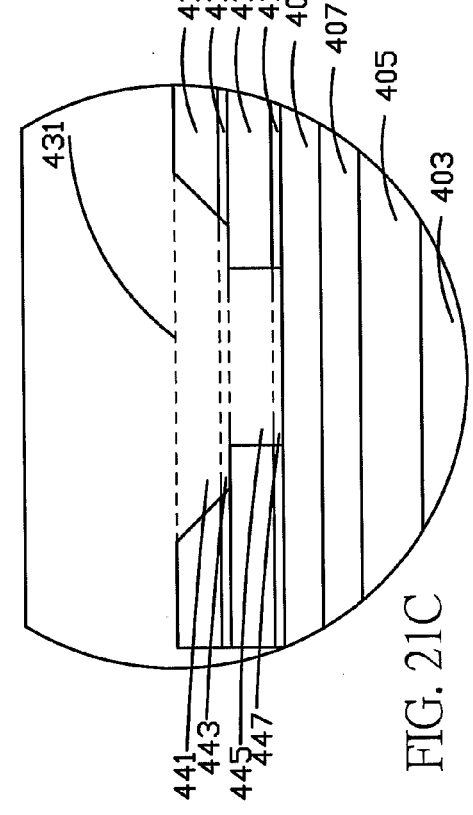
Figure 22:
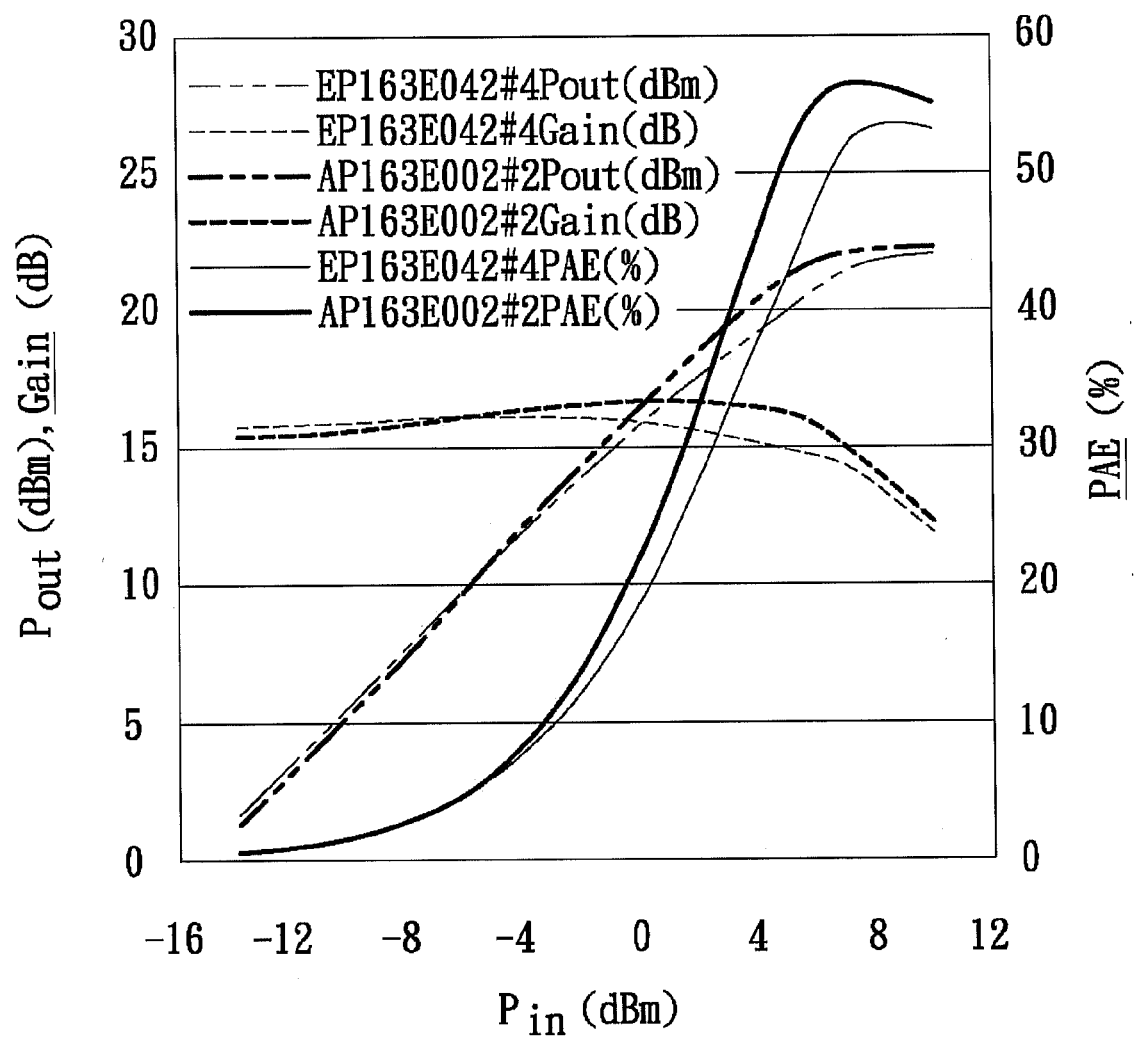
FIG. 22 is a plot showing the differences of the efficiency between the HEMT of the present invention and the HEMT of the previous technology.

The invention claimed is:

1. A high electron mobility transistor (HEMT) comprising sequentially:
    a substrate;
    a channel layer positioned above said substrate;
    a spacing layer positioned above said channel layer;
    a carrier supply layer positioned above said spacing layer;
    a Schottky layer positioned above said carrier supply;
    a first etch stop layer positioned above said Schottky layer;
    a first n type doped layer positioned above said first etch stop layer, which is formed of $Al_xGa_{1-x}As$;
    a second n type doped layer positioned above said first n type doped layer;
    a gate recess formed by using a multiple selective etching process which is terminated at said Schottky layer;
    a drain recess positioned at one end of said gate recess, which is formed by using a multiple selective etching process which is terminated at said Schottky layer;
    a source recess positioned at the other end of said gate recess, which is formed by using a multiple selective etching process which is terminated at said Schottky layer;
    a gate electrode positioned in said gate recess and formed Schottky contact to said Schottky layer;
    a drain electrode positioned in said drain recess and said second n type doped layer surrounding said drain recess, which forms ohmic contact to said second n type doped layer and said Schottky layer; and
    a source electrode positioned in said source recess and said second n type doped layer surrounding said source recess, which forms ohmic contact to said second n type doped layer and said Schottky layer.

2. The structure of HEMT according to claim 1, wherein the material used for said first n type doped layer is $Al_xGa_{1-x}As$ with an Al content, x, larger than 0.0 and smaller than 0.5, and the thickness of said first n type doped layer is larger than 0 and smaller than 100 nm.

3. The structure of HEMT according to claim 1, wherein said drain recess is formed by three recesses, including sequentially:
    a first drain recess, forming in said second n type doped layer;
    a second drain recess, forming in said first etch stop layer;
    a third drain recess, forming in said first n type doped layer,
wherein said first drain recess is larger than, equal to, or smaller than said third drain recess.

4. The structure of HEMT according to claim 1, wherein said source recess is formed by three recesses, including sequentially:
    a first source recess, forming in said second n type doped layer;
    a second source recess, forming in said first etch stop layer;
    a third source recess, forming in said first n type doped layer,
wherein said first drain recess is larger than, equal to, or smaller than said third drain recess.

5. The structure of HEMT according to claim 1, wherein said drain electrode forms ohmic contact to said first n type doped layer and forms ohmic contact to said second n type doped layer in the meantime.

6. The structure of HEMT according to claim 1, wherein said source electrode forms ohmic contact to said first n type doped layer and forms ohmic contact to said second n type doped layer in the meantime.

7. The structure of HEMT according to claim 1, wherein a second etch stop layer is inserted between said first n type doped layer and said second n type doped layer.

8. The structure of HEMT according to claim 7, wherein said second etch stop layer is formed of AlAs or InGaP.

9. The structure of HEMT according to claim 1, wherein said second n type doped layer is formed of GaAs, and the thickness of said second n type doped layer is larger than 0 and smaller than 100 nm.

10. The structure of HEMT according to claim 1, wherein said etching process is dry etching or wet etching.

11. The structure of HEMT according to claim 1, wherein said first etch stop layer is formed of AlAs or InGaP.

12. The structure of HEMT according to claim 1, wherein said Schottky layer is formed of $Al_xGa_{1-x}As$ with an Al content, x, larger than 0.0 and smaller than 0.6, and the thickness of said Schottky layer is larger than 0 and smaller than 100 nm.

13. A high electron mobility transistor (HEMT) comprises sequentially:
    a substrate;
    a channel layer positioned above said substrate;
    a spacing layer positioned above said channel layer;
    a carrier supply layer positioned above said spacing layer;
    a Schottky layer positioned above said carrier supply;
    a first etch stop layer positioned above said Schottky layer;
    a first n type doped layer positioned above said first etch stop layer;
    a second n type doped layer positioned above said first n type doped layer;
    a gate recess formed by using a multiple selective etching process and terminated the etching process at said Schottky layer;
    a drain recess positioned at one end of said gate recess, which is formed by using a multiple selective etching process which is terminated at said Schottky layer, wherein the drain recess formed in the second n type doped layer is larger than the drain recess formed in the first n type doped layer;
    a source recess positioned at the other end of said gate recess, which is formed by using a multiple selective etching process which is terminated at said Schottky layer, wherein the source recess formed in the second n type doped layer is larger than the source recess formed in the first n type doped layer;
    a gate electrode positioned in said gate recess and formed Schottky contact to said Schottky layer;
    a drain electrode positioned in said drain recess and said second n type doped layer surrounding said drain recess, which forms ohmic contact to said second n type doped layer and said Schottky layer; and
    a source electrode positioned in said source recess and said second n type doped layer surrounding said source recess, which forms ohmic contact to said second n type doped layer and said Schottky layer.

14. The structure of HEMT according to claim 13, wherein the material used for said first n type doped layer is GaAs, $Al_xGa_{1-x}As$, $In_xAl_{1-x}As$, $In_xGa_{1-x}As$, or InAlGaAs, with an Al content x in $Al_xGa_{1-x}As$ larger than 0.0 and smaller than 0.5, with an In content x in $In_xAl_{1-x}As$ larger than 0.0 and smaller than 0.5, with an In content x in $In_xGa_{1-x}As$ larger than 0.0 and smaller than 0.5, and the thickness of said first n type doped layer is larger than 0 and smaller than 100 nm.

15. The structure of HEMT according to claim 13, wherein the material used for said second n type doped layer is GaAs, $Al_xGa_{1-x}As$, $In_xGa_{1-x}As$, or InAlGaAs, with an Al content x in $Al_xGa_{1-x}As$ larger than 0.0 and smaller than 0.5, with an In content x in $In_xAl_{1-x}As$ larger than 0.0 and smaller than 0.5, with an In content x in $In_xGa_{1-x}As$ larger than 0.0 and smaller than 0.5, and the thickness of said second n type doped layer is larger than 0 and smaller than 100 nm.

16. The structure of HEMT according to claim 13, wherein said drain electrode forms ohmic contact to said first n type doped layer and forms ohmic contact to said second n type doped layer in the meantime.

17. The structure of HEMT according to claim 13, wherein said source electrode forms ohmic contact to said first n type doped layer and forms ohmic contact to said second n type doped layer in the meantime.

18. The structure of HEMT according to claim 13, wherein a second etch stop layer is inserted between said first n type doped layer and said second n type doped layer.

19. The structure of HEMT according to claim 18, wherein said second etch stop layer is formed of AlAs or InGaP.

20. The structure of HEMT according to claim 13, wherein said etching process is dry etching or wet etching.

21. The structure of HEMT according to claim 13, wherein said first etch stop layer is formed of AlAs or InGaP.

22. The structure of HEMT according to claim 13, wherein said Schottky layer is formed of $Al_xGa_{1-x}As$ with an Al content, x, larger than 0.0 and smaller than 0.6, and the thickness of said Schottky layer is larger than 0 and smaller than 100 nm.

* * * * *